(12) United States Patent
Chabinyc et al.

(10) Patent No.: US 7,755,156 B2
(45) Date of Patent: *Jul. 13, 2010

(54) PRODUCING LAYERED STRUCTURES WITH LAMINATION

(75) Inventors: Michael L. Chabinyc, San Francisco, CA (US); Tse Nga Ng, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/959,187

(22) Filed: Dec. 18, 2007

(65) Prior Publication Data

US 2009/0152534 A1    Jun. 18, 2009

(51) Int. Cl.
H01L 31/0224   (2006.01)

(52) U.S. Cl. .............. 257/443; 257/40; 257/E31.124; 257/E51.027

(58) Field of Classification Search ............... 257/40, 257/E51.027; 438/69
See application file for complete search history.

(56) References Cited

U.S. PATENT DOCUMENTS

| | | | |
|---|---|---|---|
| 4,266,334 A | 5/1981 | Edwards et al. |
| 5,454,880 A | 10/1995 | Sariciftci et al. |
| 5,504,323 A | 4/1996 | Heeger et al. |
| 5,517,031 A | 5/1996 | Wei et al. |
| 6,197,663 B1 | 3/2001 | Chandross et al. |
| 6,297,495 B1 | 10/2001 | Bulovic et al. |
| 6,300,612 B1 | 10/2001 | Yu |
| 6,806,473 B2 | 10/2004 | Honda et al. |
| 6,921,679 B2 | 7/2005 | Chabinyc et al. |
| 7,033,516 B2 | 4/2006 | Wong et al. |
| 7,091,660 B2 | 8/2006 | Park et al. |
| RE39,393 E | 11/2006 | Yamazaki |
| 7,271,535 B2 | 9/2007 | Kobayashi |

(Continued)

OTHER PUBLICATIONS

McCulloch, I., Heeney, M., Bailey, C., Genevicius, K., MacDonald, I., Shkunov, M., Sparrowe, D., Tierney, S., Wagner, R., Zhang, W., Chabinyc, M.L., Kline, R.J., McGehee, M.D., and Toney, M.F., "Liquid-crystalline semiconducting polymers with high charge-carrier mobility", nature materials, vol. 5, Apr. 2006, pp. 328-333.

(Continued)

Primary Examiner—Fernando L Toledo
Assistant Examiner—Mamadou Diallo
(74) Attorney, Agent, or Firm—Mark W. Hrozenchik; Leading-Edge Law Group, PLC

(57) ABSTRACT

A layered structure can include laminated first and second substructures and an array with cell regions. The first substructure can include layered active circuitry, the second a top electrode layer. One or both substructure's surface that contacts the other can be on a polymer-containing layer, structured to generate free charge carriers and/or to transport charge carriers. A cell region of the array can include portions of each substructure; the cell region's portion of the first substructure can include a subregion of electrically conductive material and a subregion of semiconductive material, its portion of the second can include part of the top electrode layer. The layered structure can include one or more lamination artifacts on or in the polymer-containing layer; the lamination artifacts can include artifacts of contact pressure, or heat, or of surface shape, and the interface surface can be without vias.

34 Claims, 17 Drawing Sheets

U.S. PATENT DOCUMENTS

| | | | |
|---|---|---|---|
| 7,279,777 | B2 | 10/2007 | Bai et al. |
| 7,283,768 | B2 | 10/2007 | Bandou et al. |
| 7,291,969 | B2 | 11/2007 | Tsutsui |
| 7,297,415 | B2 | 11/2007 | Noguchi et al. |
| 7,586,080 | B2 | 9/2009 | Chabinyc et al. |
| 2003/0127967 | A1 | 7/2003 | Tsutsui et al. |
| 2004/0027061 | A1 | 2/2004 | Seo et al. |
| 2004/0041097 | A1 | 3/2004 | Ishii et al. |
| 2005/0133788 | A1 | 6/2005 | Chabinyc et al. |
| 2009/0108304 | A1 | 4/2009 | Ng et al. |
| 2009/0159781 | A1 | 6/2009 | Chabinyc et al. |
| 2009/0159875 | A1 | 6/2009 | Chabinyc et al. |
| 2009/0243020 | A1 | 10/2009 | Chabinyc et al. |

OTHER PUBLICATIONS

Chabinyc, M., "Controlling the performance of semiconducting polymers for printed electronics", 2007 MRS Spring Meeting, Apr. 9-13, 2007, San Francisco, California, Abstract, 1 page.

McCulloch, I., Bailey, C., Heeney, M., Shkunov, M., Sparrowe, D., Tierney, S., Chabinyc, M., Kline, J., The development of pBTTT, 2007 MRS Spring Meeting, Apr. 9-13, 2007, San Francisco, California, Abstract, 1 page.

Notice of Allowance and Fee(s) Due in U.S. Appl. No. 11/959,901, mailed May 13, 2009, 12 pages.

Yu, G., Wang, J., McElvain, J., and Heeger, A.J., "Large-Area, Full-Color Image Sensors Made with Semiconducting Polymers," Wiley-VCH Verlag GmbH, Adv. Mater., vol. 10, No. 17, 1998, pp. 1431-1434.

Sirringhaus, H., Tessler, N., Friend, R.H., "Integrated Optoelectronic Devices Based on Conjugated Polymers," Science, vol. 280, Jun. 12, 1998, pp. 1741-1744.

Granstrom, M., Petritsch, K., Arias, A.C., Lux, A., Andersson, M.R., & Friend, R.H., "Laminated fabrication of polymeric photovoltaic diodes," Nature, vol. 395, Sep. 17, 1998, pp. 257-260.

Yu, G., Srdanov, G., Wang, J., Wang, H., Cao, Y., and Heeger, A.J., "Large area, full-color, digital image sensors made with semiconducting polymers," Synthetic Metals 111-112, 2000, pp. 133-137.

Rogers., J.A., Bao, Z., Baldwin, K., Dodabalapur, A., Crone, B., Raju. V.R., Kuck, V., Katz, H., Amundson, K., Ewing, J., and Drzaic, P., "Paper-like electronic displays: Large-area rubber-stamped plastic sheets of electronics and microencapsulated electrophoretic inks," PNAS, vol. 98, No. 9, Apr. 24, 2001, pp. 4835-4840.

Arias. A.C., "Vertically Segregated Polymer Blends: Their Use in Organic Electronics," Journal of Macromolecular Science, Part C: Polymer Reviews, vol. 46, 2006, pp. 103-125.

Loo, Y.-L., Someya, T., Baldwin, K.W., Bao, Z., Ho, P., Dodabalapur, A., Katz, H.E., and Rogers, J.A., "Soft, conformable electrical contacts for organic semiconductors: High-resolution plastic circuits by lamination," PNAS, vol. 99, No. 16, Aug. 6, 2002, pp. 10252-10256.

Street, R.A., Graham, J., Popovic, Z.D., Hor, A., Ready, S., Ho, J., "Image sensors combining an organic photoconductor with a-Si:H matrix addressing," Journal of Non-Crystalline Solids 299-302, 2002, pp. 1240-1244.

Chabinyc, M.L., Salleo, A., Wu, Y., Liu, P., Ong, B.S., Heeney, M., and McCulloch, I., "Lamination Method for Study of Interfaces in Polymeric Thin Film Transistors," J. Am. Chem. Soc., vol. 126, 2004, pp. 13928-13929.

Someya, T., Kato, Y., IBA, S., Noguchi, Y., Sekitani, T., Kawaguchi, H., and Sakurai, T., "Integration of Organic FETs With Organic Photodiodes for a Large Area, Flexible, and Lightweight Sheet Image Scanners," IEEE Transactions on Electron Devices, vol. 52, No. 11, Nov. 2005, pp. 2502-2511.

Huang, A., "Fabrication and Test Characterization of Organic Poly (3,3'" dialkylquarterthiophene) (PQT-12) Transistors," 24th Annual Microelectronic Engineering Conference, May 2006, pp. 20-24.

Wong, W.S., Ready, S.E., Matusiak, R., White, S.D., Lu, J.-P., Ho, J.H., and Street, R.A., "Amorphous silicon thin-film transistors and arrays fabricated by jet printing," Applied Physics Letters, vol. 80, No. 4, Jan. 28, 2002, pp. 610-612.

Wong, W.S., Ng, T.N., Chabinyc, M.L., Lujan, R.A., Apte, R.B., Sambadan, S., Limb, S., and Street, R.A., Flexible a-Si:H-based Image Sensors Fabricated by Digital Lithography, 2007 Materials Research Society, Spring Meeting, Apr. 9-13, 2007, San Francisco, 5 pages.

Ng, T.N., Wong, W.S., Lujan, R.A., Apte, R.B., Chabinyc, M.L. Sambadan, S., Ready, S., Limb, S., and Street, R.A., "Flexible light sensor arrays fabricated by digital lithography," slides presented at Materials Research Society, Spring Meeting, Apr. 9-13, 2007, San Francisco, 14 pages.

Ng, T.N., Lujan, R.A., Sambadan, S., Street, R.A., Limb, S., and Wong, W.S., "Low temperature a-Si:H photodiodes and flexible image sensor arrays patterned by digital lithography," Applied Physics Letters, vol. 91, 2007, pp. 063505-1 through -3.

Office communication in U.S. Appl. No. 11/960,874, mailed Oct. 28, 2009, 20 pages, published in PAIR.

Amendment in U.S. Appl. No. 11/960,874, submitted Dec. 14, 2009, 21 pages, published in PAIR.

Office communication in U.S. Appl. No. 11/960,874, mailed Mar. 4, 2010, 15 pages, published in PAIR.

Office communication in U.S. Appl. No. 12/482,610, mailed on Apr. 23, 2010, 15 pages, published in PAIR.

Amendment in U.S. Appl. No. 11/960,874, submitted on Apr. 23, 2010, 18 pages, published in PAIR.

Office communication in U.S. Appl. No. 11/960,874, mailed on May 10, 2010, 3 pages, published in PAIR.

PRODUCING LAYERED STRUCTURES WITH LAMINATION

BACKGROUND OF THE INVENTION

The present invention relates generally to production of layered structures with lamination. For example, the layered structures can be light-interactive devices such as photosensing arrays.

A multitude of layered structures produced with lamination have been proposed for many different uses. For example, Someya, T., Kato, Y., Iba, S., Noguchi, Y., Sekitani, T., Kawaguchi, H., and Sakurai, T., "Integration of Organic FETs With Organic Photodiodes for a Large Area, Flexible, and Lightweight Sheet Image Scanners", *IEEE Transactions on Electron Devices*, Vol. 52, No. 11, November 2005, pp. 2502-2511 describe a manufacturing process for image scanners in which an organic FET matrix and a photodiode matrix are manufactured separately on different plastic films and then laminated with each other using a silver paste patterned by a microdispenser or using anisotropic conductive films.

Granström, M., Petritsch, K., Arias, A. C., Lux, A., Andersson, M. R., and Friend, R. H., "Laminated fabrication of polymeric photovoltaic diodes", *Nature*, Vol. 295, September 1998, pp., 257-260, describe laminated diodes assembled by forming a POPT-rich film on an ITO- or PEDOT-coated glass and an MEH-CN-PPV-rich film on an aluminium or calcium-coated glass substrate and by performing lamination at an elevated temperature.

U.S. Pat. No. 6,197,663 describes a process for fabricating integrated circuit devices that have thin film transistors (TFTs) and an electrical interconnect structure. Some constituents of TFTs are formed on a first structure, at least the interconnect structure is formed on a second structure, and the two are laminated to form the device with fully formed TFTs.

Loo Y.-L., Someya, T., Baldwin, K. W., Bao, Z., Ho, P., Dodabalapur, A., Katz, H. E., and Rogers, J. A., "Soft, conformable electrical contacts for organic semiconductors: High-resolution plastic circuits by lamination," PNAS, Vol. 99, No. 16, Aug. 6, 2002, pp. 10252-10256, describe a technique in which a thin elastomeric film on a plastic substrate supports electrodes and interconnections. This substrate is laminated against another plastic substrate that supports gate, dielectric, and semiconductor levels, establishing effective electrical contacts and completing the circuits.

Rogers, J. A., Bao, Z., Baldwin, K., Dodabalapur, A., Crone, B., Raju, V. R., Kuck, V., Katz, H., Amundson, K., Ewing, J., and Drzaic, P., "Paper-like electronic displays: Large-area rubber-stamped plastic sheets of electronics and microencapsulated electrophoretic inks," PNAS, Vol. 98, No. 9, Apr. 24, 2001, pp. 4835-4840, describe production of displays that include circuits on plastic substrates integrated with microencapsulated electrophoretic "inks" to form sheets. For example, a semiconductor is deposited on top of a printed substrate to produce a functional backplane circuit. Annealing is performed, primarily to reduce off currents and variations in on currents, and, in some cases, transistors are encapsulated with a thin layer of low temperature $SiN_x$.

It would be advantageous to have improved techniques for layered structures produced by lamination.

SUMMARY OF THE INVENTION

The invention provides various exemplary embodiments, including structures, devices, arrays, and methods. In general, the embodiments are implemented with lamination.

These and other features and advantages of exemplary embodiments of the invention are described below with reference to the accompanying drawings.

DETAILED DESCRIPTION

Figure 1:
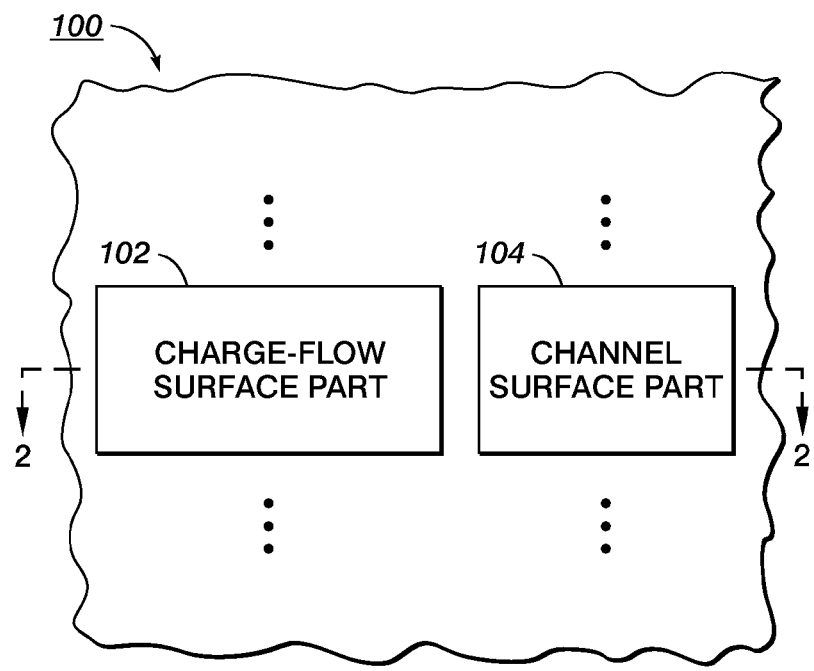
FIG. 1 is a schematic top view of a fragment of a layered structure in which a substructure has charge-flow surface parts and channel surface parts.

In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the claims. In the description and the claims, the words "a" or "an" include any number greater than or equal to one.

Many electronic parts, components, and devices can be implemented with layered structures, i.e. structures that include layers. Such structures typically include layers or parts of layers that are electrically conductive and other layers or parts of layers that are electrically insulating. Still other layers or parts of layers are "semiconductive", meaning that they can be either electrically insulating or electrically conductive, depending on one or more conditions or stimuli that can change without departing from applicable normal operating conditions. Electrically conductive, electrically insulating (e.g. dielectric), and semiconductive layers or parts of layers can each be implemented with a wide variety of materials in a wide variety of geometries; regardless of the materials and geometry, a part of a layer that has a certain characteristic and that extends in three dimensions is sometimes referred to herein as a "region", "subregion", or a "portion" of a layer, region, or subregion.

The exemplary implementations described below address problems that arise with layered structures that include electrically conductive and/or semiconductive material.

For example, specific problems arise with fabrication techniques in which one material is deposited on another, because such deposition tends to produce defects referred to as "pin-holes". Pin-holes can arise, for example, where one polymer is deposited over another and both are miscible in the same solvent; they can also arise when a top metal layer is deposited on almost any polymer material, such as by evaporation or sputtering.

The exemplary implementations described below include various features that address these and related problems.

In general, the implementations involve structures, articles, or parts or components of structures or articles that are connected in some way. For example, structures, articles, or parts or components of structures or articles may sometimes be referred to as "attached" to each other or to other structures, articles, parts, or components or vice versa, and operations are performed that "attach" structures, articles, or parts or components of structures or articles to each other or to other things or visa versa; the terms "attached", "attach", and related terms refer to any type of connecting that could be performed in the context. One type of attaching is "mounting", which occurs when a first part or component is attached to a second part or component that functions as a support for the first. In contrast, the more generic term "connecting" includes not only "attaching" and "mounting", but also integrally forming a structure or a structure's components or parts and making other types of connections such as electrical connections between or among devices or components of circuitry. A combination of one or more parts connected in any way is sometimes referred to herein as a "structure"; a structure may include one or more structures within it, sometimes referred to herein as "substructures".

An "electronic component" or simply "component" is a part within which, in operation, movement of charge carriers occurs, such as movement of electrons or holes. Unless the context indicates otherwise, the terms "circuitry" and "circuit" are used herein to refer to structures in which one or more electronic components have sufficient electrical connections to operate together or in a related manner. In some instances, an item of circuitry can include more than one circuit.

A "lead" is a part of a component at which the component is electrically connected to one or more other components, while a "line" is a simple electrically conductive component, typically extending between and electrically connecting two or more leads or other electrical connection points; a line could, for example, carry electrical signals, such as a data line in an array. A "channel" is a part of a component through which electrical current can flow by movement of charge carriers. A channel typically extends between two ends, sometimes referred to as "channel ends", and leads through which channel ends are electrically connected to other components are sometimes referred to herein as "channel leads". A channel is "conductive" when it is in a state in which current can flow through it.

A "transistor" is a component that has a channel that extends between two channel leads, and that also has a third lead—referred to as a "gate lead" or simply "gate"—such that the channel can be switched or otherwise controlled between high and low impedance by electrical signals that change potential difference between the gate and one of the channel leads. If a transistor is structured or connected so that the channel's conductivity is always controlled by the potential difference between the gate and the same one of the channel leads, that channel lead is referred to as the "source", while the other channel lead is referred to as the "drain". Other components may have leads called gates, sources, drains, and so forth by analogy to transistors.

Some of the components described herein employ structures with one or more dimensions smaller than 1 mm, and various techniques have been proposed for producing such structures. In particular, some techniques for producing such structures are referred to as "microfabrication." Examples of microfabrication include various techniques for depositing materials such as growth of epitaxial material, sputter deposition, evaporation techniques, plating techniques, spin coating, printing, and other such techniques; techniques for patterning materials, such as etching or otherwise removing exposed regions of thin films through a photolithographically patterned resist layer or other patterned layer; techniques for polishing, planarizing, or otherwise modifying exposed surfaces of materials; and so forth.

In general, some of the structures, elements, and components described herein are supported on a "support structure" or "support surface", which terms are used herein to mean a structure or a structure's surface that can support other structures. More specifically, a support structure could be a "substrate", used herein to mean a support structure on a surface of which other structures can be formed or attached by microfabrication or similar process.

As used herein, a "layer" is a thickness of material, whether or not patterned in any way. A layer "includes" a specified type of material if material of the specified type is present in any part of the layer; a layer is "of" a specified type of material if material of the specified type is predominant throughout the layer. A layer may be homogeneous or its composition or characteristics may vary. A layer may include two or more layers or parts of layers within it, sometimes referred to as "sublayers". An "insulating layer" is a layer that is electrically insulating, while a "conductive layer" is a layer that is electrically conductive.

As mentioned above, a "layered structure" refers herein to a structure that includes layers, such as microfabricated or thin film layers. A layered structure can be on a substrate or other support structure; a substrate can itself be one of the layers in a layered structure, and the substrate may in turn include layers within its structure. More generally, a layer can be or include a layered structure.

An "integrated structure", "integrated circuit", or "IC" is a structure with electronic components and connections produced by microfabrication or similar processes. Implementations of ICs described herein include features characterized as "cells" (or "elements") and "arrays", terms that are used with related meanings: An "array" is an arrangement of "cells" or "elements"; unless otherwise indicated by the context, the words "cell" and "element" are used interchangeably herein to mean a cell or an element of an array. In a layered structure that is an array, each cell's portion of the layered structure is sometimes referred to herein as a "cell region".

"Light" refers herein to electromagnetic radiation of any wavelength or frequency. The term "sensing" is used herein in the most generic sense of obtaining information from a physical stimulus; sensing therefore includes actions such as detecting, measuring, and so forth. To "photosense" is to sense light. Light that is photosensed or otherwise received by an electronic component is sometimes referred to herein as "incident light". An IC with an array of cells, at least some of which perform photosensing, is sometimes referred to herein as a "photosensing array". A "photoconductive" material, or simply a "photoconductor", is a material that generates free charge carrier, such as free electron-hole pairs, in response to incident light; photoconductive materials can be used in producing various kinds of photosensors.

An "electrode" is a conductive part or component of an electronic device; although the term "electrode" is usually used for a part or component that operates in some way other than solely as a line, an electrode could be part of a line. Various electrodes can, for example, operate as gate, source, and drain of transistor structures, as plates of capacitive components, as contact pads, and so forth. As used herein, a "cell electrode" is an electrode within a cell region, typically within an active circuitry layer of the cell region.

A structure may be described by its operation, such as a "carrier-transporting" structure or substructure in an electronic component, meaning a layered structure within which charge carriers are transported during operation of the component. Also, an "active layered" structure or substructure in an electronic component means a layered structure within which charge carriers move to store or transfer information during operation of the component, such as in operations that accumulate or store charge or provide or receive electrical signals; an active layered structure or substructure could, for example, include channels of one or more transistors. In addition, a structure may be characterized by the nature of its parts or the way in which they are connected, such as a "circuitry substructure" in which parts are connected into circuitry; an "array structure", meaning a structure such as an IC that includes an array; or a "layered array structure", meaning a layered structure that is also an array structure.

Similarly, a layer may be described by its operation, such as an "active circuitry layer", meaning a layer within which charge carriers move during operation; an active circuitry layer could similarly include channels of one or more transistors. Also, a "top electrode layer" is typically used herein to mean a layer that is not an active circuitry layer but that includes electrodes that can operate as top electrodes for cells of an array; as used herein, a "top electrode" need not be on top of an array or over or above the array, but is typically separated from an active circuitry layer of an array by one or more other layers that are neither electrode layers nor active circuitry layers. In addition, a layer or region or subregion of a layer may be characterized by the material it contains, a description of its conductivity, or another characteristic of its structure.

Top electrodes in arrays provide a directional orientation as follows: A direction away from a top electrode toward an active circuitry layer is "down", "under", or "below", while a direction from an active circuitry layer toward a top electrode is "up", "over", or "above". The terms "upper" and "top" are typically applied to structures, components, or surfaces disposed toward, at, or above a top electrode, while "lower" or "underlying" are applied to structures, components, or surfaces disposed toward, at, or below an active circuitry layer. In general, it should be understood that the above directional orientation is arbitrary and only for ease of description, and that an array may have any appropriate orientation. Also, a similar orientation could be applied by analogy to a structure that does not include a top electrode or to an incomplete structure to which a top electrode has not yet been attached.

A structure or component is "directly on" or sometimes simply "on" a surface when it is both over and in contact with the surface; more generally, two surfaces "meet each other" or simply "meet" when they are in contact in the same way they would be if one were directly on the other. A structure is "fabricated on" a surface when the structure was produced on or over the surface by microfabrication or similar processes. A process that produces a layer or other accumulation of material over or directly on a surface, such as a substrate's surface, can be said to "deposit" the material.

A surface is "on" a layer or layer part such as a region or subregion, or the layer or layer part "has" a surface, if the surface is an exterior surface of the layer or layer part such as an exposed surface or a surface at which it meets another layer or layer part. Similarly, a surface is "on" a layered structure or substructure, or the structure or substructure "has" a surface, if the surface is an exterior surface of the layered structure or substructure such as an exposed surface or a surface at which it meets another structure or substructure. Conversely, a layer is deposited or otherwise produced "on" a structure or substructure if, after its production, the layer is on a surface that was previously an external surface of the structure or substructure; after production, such a layer may be described herein as included in the structure or substructure on which it was produced.

Some of the exemplary implementations described below include a "laminating" or "lamination" operation, meaning an operation that occurs in producing a layered structure and that attaches two or more previously existing substructures, with each pair of adjacent substructures having surfaces that meet each other; after a laminating or lamination operation, the substructures are referred to as "laminated". In a typical implementation, each laminated substructure is also a layered structure produced, for example, by microfabrication, lamination, or similar operations. The term "lamination artifact" refers herein to an artifact that exists in a layered structure and that resulted from a laminating or lamination operation performed in producing the layered structure.

Figure 2:
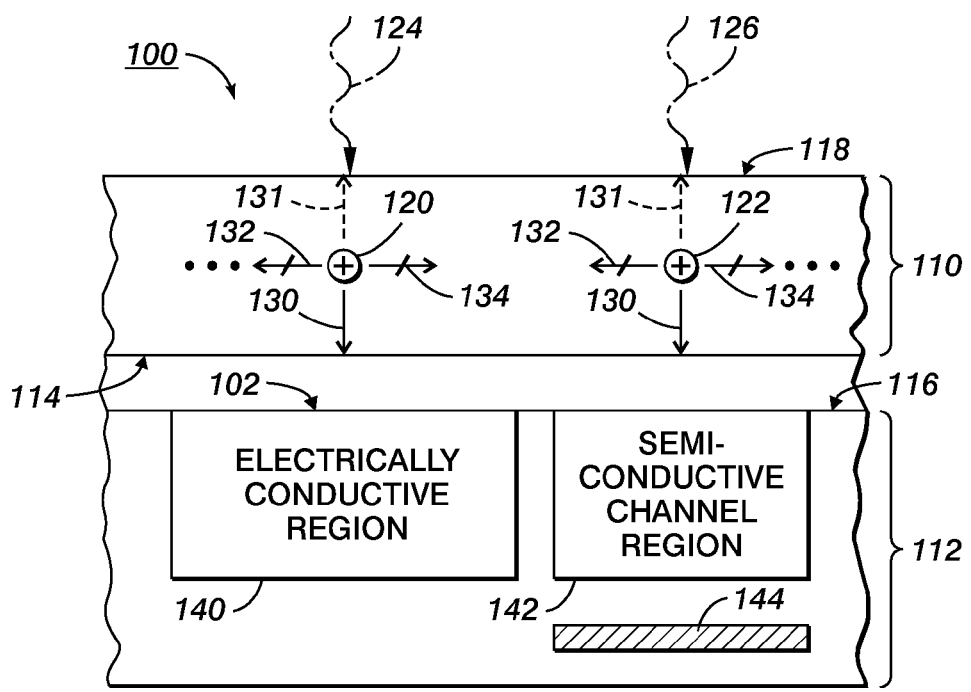
FIG. 2 is a schematic cross section of a fragment as in FIG. 1, taken along the line 2-2 in FIG. 1.

FIGS. 1 and 2 show an example of a layered structure that includes a substructure with two different types of surface parts on two different types of regions. Structure fragment 100 includes one or more charge-flow surface parts, with surface part 102 being a representative example, as suggested by the ellipses above and below it. Similarly, structure fragment 100 includes one or more channel surface parts, with surface part 104 being a representative example, as suggested by the ellipses above and below it.

The cross-section of fragment 100 in FIG. 2 shows two substructures, carrier-transporting substructure 110 and circuitry substructure 112, with respective surfaces 114 and 116 disposed toward each other and with substructure 110 also having surface 118 disposed away from substructure 112; where surfaces are disposed toward each other, as surfaces 114 and 116 are in FIG. 2, one or both of them may be referred to as a "facing surface". Although surfaces 114 and 116 are shown slightly separated for illustratively purposes, they could meet, as in some exemplary implementations described below; also, rather than being approximately flat as shown, surfaces 114 and 116 could each depart from flatness, as in some of the exemplary implementations. Even if they depart from flatness, however, each of surfaces 114 and 116 extends "approximately perpendicularly" to a thickness direction of its structure or substructure, meaning that most of its area is closer to being perpendicular to the thickness direction than to being parallel to it, even though such a surface can locally include a relatively small area that is closer to being parallel to the thickness direction, as illustrated in some of the exemplary implementations described below.

In operation, substructure 110 transports charge carriers, illustratively shown by holes 120 and 122; a carrier-transporting substructure could transport other types of charge carriers such as electrons, for example, depending on materials in the substructure. In the illustrated example, holes 120 and 122 are transported to surface 114, which operates as an output surface for substructure 110, but the direction of transport could instead be toward surface 118 which could also operate as an output surface, providing charge carriers to a top electrode or other conductive component (not shown). In general, direction of charge carrier transport depends on orientation of electric field, sign of charge carriers, and properties of material in substructure 110. A net current can flow across substructure 110, such as due to charge injection at the surface opposite an output surface at which charge carriers are provided.

As suggested by rays 124 and 126 incident on substructure 110, holes 120 and 122 are transported to one of surfaces 114 and 118 in response to incident light.

In exemplary implementations described below, substructure 110 includes one or more layers or sublayers of material that are produced by solution processing. As used herein, the term "solution processing" includes any of a variety of processing techniques in which coatings, films, or other layers are produced, not by melt processing or the like, but by using a solution of material in a solvent; solution processing therefore typically includes drying or removal of solvent from a solution. Examples of materials that can be used in solution processing include polymer material or blends of polymers and small molecules or other polymers (e.g. a tetraphenylenediamine in polycarbonate); examples of polymers that can be used in solution processing include "organic polymer", referring herein to any material that includes polymerized organic compounds, such as poly(3-hexylthiophene) or poly[(2-alkoxy,5-alkoxy)-1,4-phenylene vinylene]; other examples of materials that can be used in solution processing include inorganic materials such as amorphous silicon or colloidal particles such as nanoparticles of PbS or PbSe, i.e. particles with diameter not greater than approximately 100 nm. As used herein, the more general terms "polymer" and "polymer material" include not only any organic polymer as defined above but also any "inorganic polymer", i.e. a material that contains a backbone of polymerized inorganic compounds, e.g. a polysilane, whether or not it can be used in solution processing.

In operation, substructure 110 transports charge carriers such as holes anisotropically, as illustrated by arrows 130, 131, 132, and 134 in FIG. 2; as used herein, charge carriers are transported "anisotropically" if they are transported at different speeds in different directions. For example, arrows 130 indicate that holes 120 and 122 are transported at a relatively high speed toward surface 114, and dashed arrows 131 similarly indicate that holes 120 and 122 could alternatively be transported at a relatively high speed toward surface 118; crossed arrows 132 and 134, on the other hand, indicate that holes 120 and 122 are transported at relatively low speeds or not at all in leftward and rightward directions, respectively, parallel to surfaces 114 and 118. More specifically, transport in directions parallel to surfaces 114 and 118 is "negligible", meaning that if a charge carrier's net resultant transport were analyzed into vectors perpendicular and parallel to surface 114, the parallel vector's magnitude is a small fraction of the perpendicular vector's magnitude, such as approximately $\frac{1}{100}$ or less.

In a structure as in FIGS. 1 and 2, directions that are approximately perpendicular to surface 114 or surface 118 are sometimes referred to as "thickness directions", while directions that are approximately parallel to surface 114 or surface 118 are sometimes referred to as "lateral directions". Various techniques could be used to measure carrier mobility in lateral directions and in thickness directions in a given carrier-providing substructure, and it is foreseeable that additional mobility measuring techniques will be discovered, so that the scope of meaning of "negligible transport" and related terms are not limited to measurements made in ways currently known.

In substructure 112, surface part 102 is on electrically conductive region 140, while surface part 104 is on semiconductive channel region 142. An additional feature is suggested by gate part 144, an electrically conductive part that could be in any suitable position in the layered structure and that controls the conductivity of channel region 142; more specifically, region 142 is one of a set of semiconductive channel regions in the layered structure, each of which, in response to a respective gate part, operates as an acceptable switch between conductive and nonconductive states for a given application. Specific ways in which this feature can be implemented are illustrated in relation to some of the exemplary implementations described below.

Figure 3:
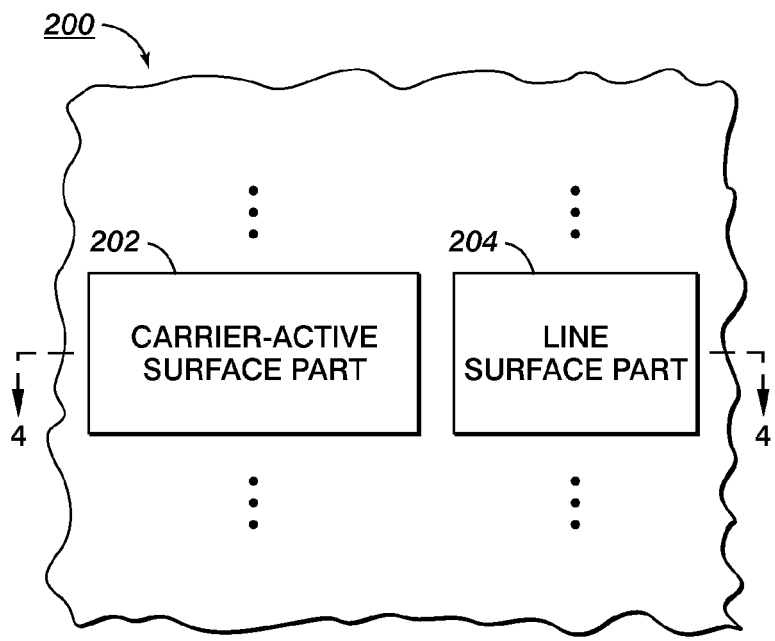
FIG. 3 is a schematic top view of a fragment of a layered structure in which a substructure has carrier-active surface parts and line surface parts.
Figure 4:
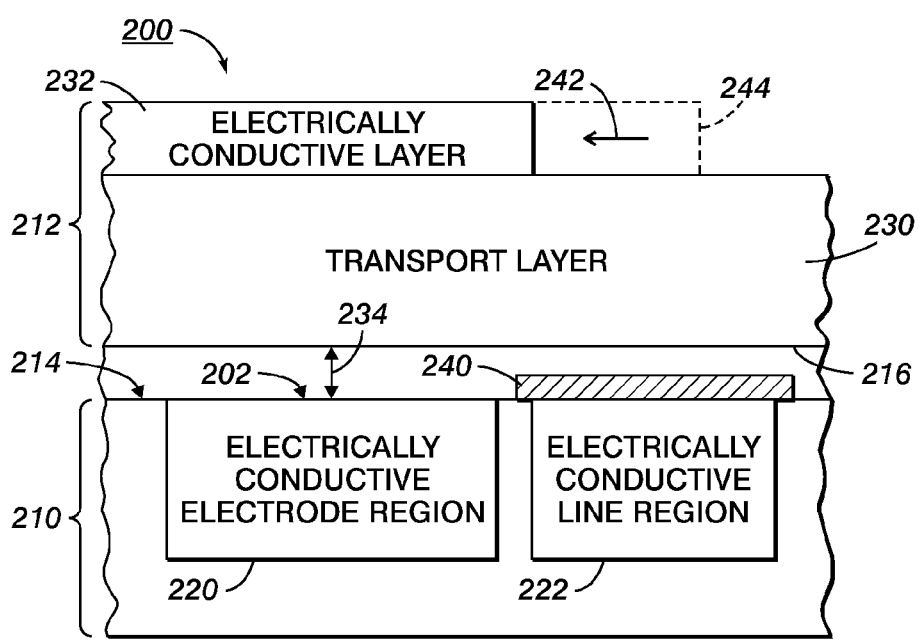
FIG. 4 is a schematic cross section of a fragment as in FIG. 3, taken along the line 4-4 in FIG. 3.

FIGS. 3 and 4 show another example of a layered structure that includes a substructure with two different types of surface parts on two different types of regions; a layered structure as in FIGS. 1 and 2 could also be an example of a layered structure as in FIGS. 3 and 4, and the techniques of FIGS. 3 and 4 can therefore be applicable in FIGS. 1 and 2. Structure fragment 200 includes one or more carrier-active surface parts, with surface part 202 being a representative example, as suggested by the ellipses above and below it. Similarly, structure fragment 200 includes one or more channel surface parts, with surface part 204 being a representative example, as suggested by the ellipses above and below it.

The cross-section of fragment 200 in FIG. 4 shows first and second substructures 210 and 212, with respective surfaces 214 and 216 disposed toward each other. As in FIG. 2, surfaces 214 and 216 are shown slightly separated for illustratively purposes, but they could meet, as in some exemplary implementations described below; also, rather than being approximately flat as shown, surfaces 214 and 216 could each depart from flatness, as in some of the exemplary implementations.

In substructure 210, surface part 202 is on electrically conductive electrode region 220, while surface part 204 is on electrically conductive line region 222. Although regions 220 and 222 could be implemented in the same electrically conductive material, as in some exemplary implementations described below, they operate differently: While line region 222 operates to transfer signals to or from other circuitry, possibly including other parts (not shown) in the same layer of material, electrode region 220 operates as part of another component, illustratively including parts of substructure 212.

Substructure 212 includes transport layer 230, an example of a "charge transport layer". The term "charge transport layer", or simply "transport layer", is used herein to refer to a layer through which charge carriers can be transported. Similarly, the term "charge generation layer" is used to refer to a layer within which free charge carriers can be generated or produced, such as in response to incident light. These terms are not, however, mutually exclusive, and charge generation and transport could occur in the same layer, such as in different regions or sublayers. A layer in which at least one of charge generation and transport can occur is sometimes referred to herein as "structured so that free charge carriers can be generated in it or charge carriers can be transported through it".

In operation of electrode region 220, charge carriers (not shown) are transported in the thickness direction of transport layer 230 in response to an electric field between electrode region 220 and electrically conductive layer 232. As suggested by bidirectional arrow 234, charge carriers could in principle be transported in either direction, but typically the predominant direction of charge carrier transport depends on the particular implementation, as illustrated by exemplary implementations described below. For example, free charge carriers produced near layer 232 in response to incident light could be transported through transport layer 230 to electrode region 220, or free charge carriers produced near region 220 in response to incident light could be transported through transport layer 230 to layer 232.

Due to signals transferred in line region 222, voltage potential difference can occur between region 222 and layer 232, in which case leakage can occur between region 222 and layer 232, interfering with signal strength or, in other words, introducing noise into signals. FIG. 4 illustrates two techniques that can be used separately or together to prevent leakage between region 222 and layer 232: In one technique, electrically insulating layer portion 240 covers line surface part 204; in another technique, layer 232 has an open region defined in it so that layer 232 does not extend substantially over line surface part 204, as suggested by arrow 242, showing how the edge of layer 232 differs from dashed outline 244 which does extend substantially over line surface part 204. Specific ways in which these techniques can be implemented are illustrated in relation to some of the exemplary implementations described below. The effectiveness of each technique may depend in part on whether transport layer 230 transports charge carriers anisotropically with transport in directions parallel to surface 216 being negligible—in this case, the open region technique may be more effective than it would be in other cases.

Figure 5:
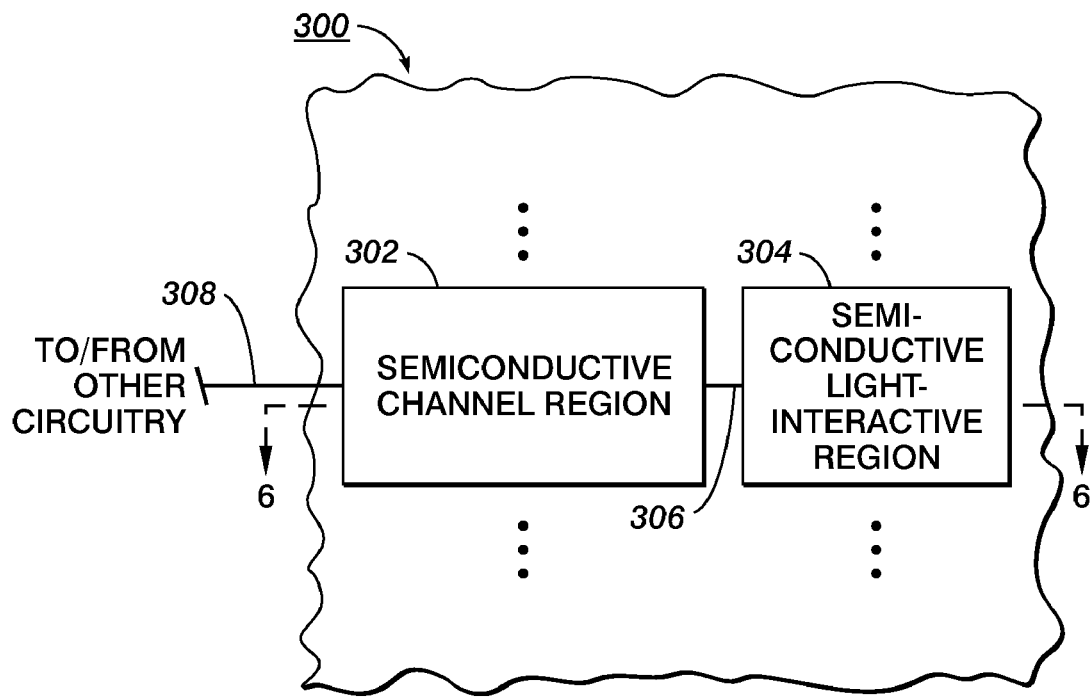
FIG. 5 is a schematic top view of a fragment of a layered structure that includes semiconductive channel regions and semiconductive light-interactive regions.
Figure 6:
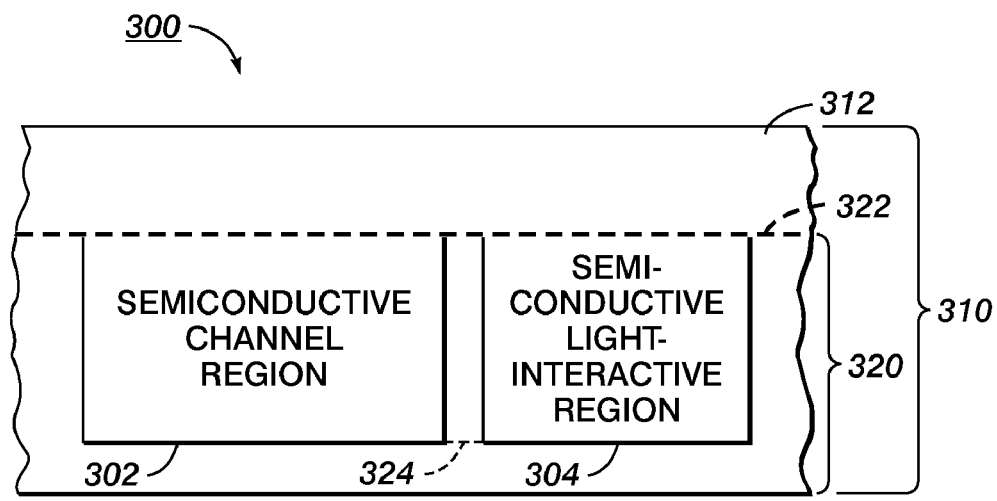
FIG. 6 is a schematic cross section of a fragment as in FIG. 5, taken along the line 6-6 in FIG. 5.

FIGS. 5 and 6 show another example of a layered structure that includes two different types of regions, each of which is semiconductive. Structure fragment 300 includes one or more semiconductive channel regions, with channel region 302 being a representative example, as suggested by the ellipses above and below it. Similarly, structure fragment 300 includes one or more semiconductive light-interactive regions, with light-interactive region 304 being a representative example, as suggested by the ellipses above and below it. Electrical connection 306 between regions 302 and 304 and electrical connection 308 between region 302 and other circuitry make it possible for channel region 302 to operate as a transistor: When channel region 302 is conductive as in a transistor's on-state, it provides an electrical connection between light-interactive region 304 and other circuitry.

The term "light-interactive" is used herein to describe an article, component, or part such as a device, array, layer, region, subregion, or other layer part in which interaction occurs between light and matter; a charge generation layer in which free charge carriers are generated in response to light, for example, is a light interactive layer, and there are several other kinds of light interaction, including interactions in which light is emitted or somehow controlled by matter. In operation of a typical photosensing device or array, light interaction results in electrical signals that provide information about light, such as its intensity or photon energy.

The cross-section of fragment 300 in FIG. 6 shows regions 302 and 304 and their relationship to a surface of fragment 300, which could, for example, be a surface at which the layered structure that includes fragment 300 meets another structure; the other structure could, for example, be another substructure of a larger article that also includes the layered structure. If fragment 300 includes set 310 of layers, then regions 302 and 304 are not exposed at surface 312, but rather are under one or more other layers. If, on the other hand, fragment 300 includes set 320 of layers, then both of regions 302 and 304 are exposed at surface 322, and each of them is under a respective surface part, similarly to surface parts 102 and 104 in FIG. 1. Other variations are also possible, in which one of regions 302 and 304 is exposed and is under a respective surface part while the other is not exposed at a surface. Also, rather than being approximately flat as shown, surfaces 312 and 322 could each depart from flatness, as in some of the exemplary implementations.

As suggested by dashed line 324 extending between their collinear lower surfaces, regions 302 and 304 both include the same semiconductive material, such as a semiconductive polymer material. Although regions 302 and 304 could have been produced in various ways, such as with photolithography or printing, they can both be produced by a process appropriate to the semiconductive material they share, which could advantageously reduce the number of operations or the number of different processes necessary to produce the layered structure.

Figure 7:
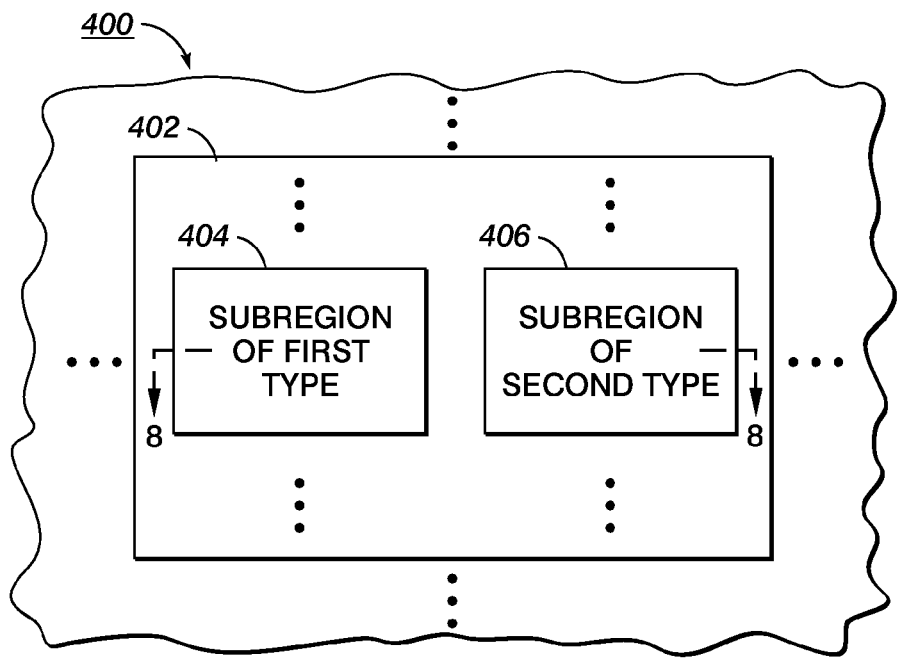
FIG. 7 is a schematic top view of a fragment of an integrated circuit (IC) that includes subregions of first and second types.
Figure 8:
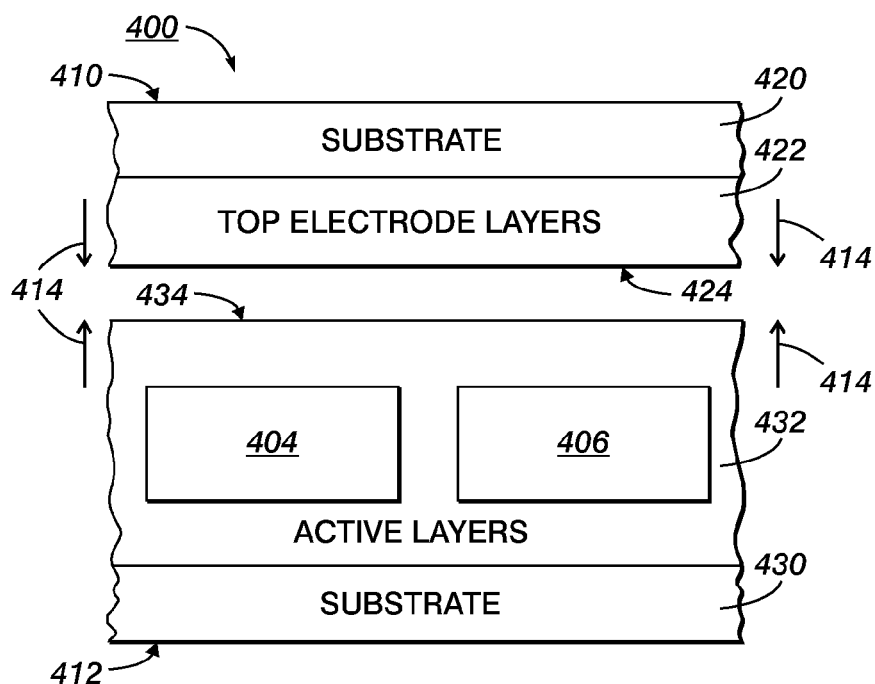
FIG. 8 is a schematic cross section of a stage in production of an IC as in FIG. 7, taken along the line 8-8 in FIG. 7.

FIGS. 7 and 8 show another example of an article that includes a layered structure. In this example, the layered structure includes an array in which a set of cell regions each include two different types of subregions, and subregions of each type include either electrically conductive or semiconductive material. More specifically, each cell region can include at least a first subregion that includes electrically conductive material and a second subregion that includes semiconductive material.

Article fragment 400 includes a number of such cell regions, with cell region 402 being a representative example, as suggested by the ellipses above, below, left of, and right of it; the array can, for example, be a two-dimensional (2D) array. Cell region 402 includes one or more subregions of a first type, with region 404 being a representative example, as suggested by the ellipses above and below it. Similarly, cell region 402 includes one or more subregions of a second type, with subregion 406 being a representative example, as suggested by the ellipses above and below it.

The cross-section in FIG. 8 shows a stage in one technique that can be used to produce an article that includes fragment 400. At this stage, substructures 410 and 412 are being moved relative to each other, as indicated by arrows 414, as part of a lamination operation; such movement could be accomplished by moving either or both of substructures 410 and 412 in any appropriate way to produce relative movement toward each other, including, for example, moving substructures 410 and 412 themselves toward each other in a suitable orientation. As used herein, an operation "moves" or is "moving" a combination of one or more structures or substructures if at least one of the structures or substructures moves relative to another during the operation; such an operation could be performed by hand or with one or more machines, with any appropriate combination of operator control and automation.

To assist in attaching substructures 410 and 412 to each other, lamination can include one or more additional operations performed at appropriate times, such as applying pressure in the directions indicated by arrows 414, increasing temperature, and so forth. As used herein, an operation "attaches" or is "attaching" a combination of two or more structures or substructures if the structures or substructures are attached to each other during the operation; as with an operation that moves, an operation that attaches could be performed by hand or with one or more machines, with any appropriate combination of operator control and automation.

As shown, substructure 410 includes substrate 420 and top electrode layers 422 with surface 424, while substructure 412 includes substrate 430 and active layers 432 with surface 434. Subregions 404 and 406 are within active layers 432, which include an array of active circuitry, while top electrode layers 422 include top electrodes for the active circuitry. At least one of surfaces 424 and 434 is on a layer that includes polymer material, and such a layer is sometimes referred to herein as a "polymer-containing layer".

The operation that moves substructures 410 and 412 as indicated by arrows 414 causes surfaces 424 and 434 to "move toward each other until they meet", meaning that surfaces 424 and 434 are separated by at least some gap before the operation but meet each other after the operation as a result of movement during the operation. Surfaces 424 and 434 can meet at an interface surface across which, during operation, charge carriers can be transported, such as in the ways described above in relation to FIGS. 1-4; examples of charge generation and transport layers appropriate for lamination in this manner are illustrated in some of the exemplary implementations described below. More generally, the term "interface surface" is used herein to refer to an internal surface that results from a lamination operation and that is a surface at which surfaces of laminated structures or substructures meet, whether or not charge carriers can be transported across the interface surface.

When a lamination operation as in FIG. 8 is completed, surfaces 424 and 434 have met and substructures 410 and 412 are attached to each other, forming an article that includes a layered structure with both of substructures 410 and 412. Attachment of substructures 410 and 412, such as at an interface surface where surfaces 424 and 434 meet, can be accomplished in various ways, including examples illustrated in some of the exemplary implementations described below. Also, rather than being approximately flat as shown, surfaces 424 and 434 could each depart from flatness, as in some of the exemplary implementations.

Figure 9:
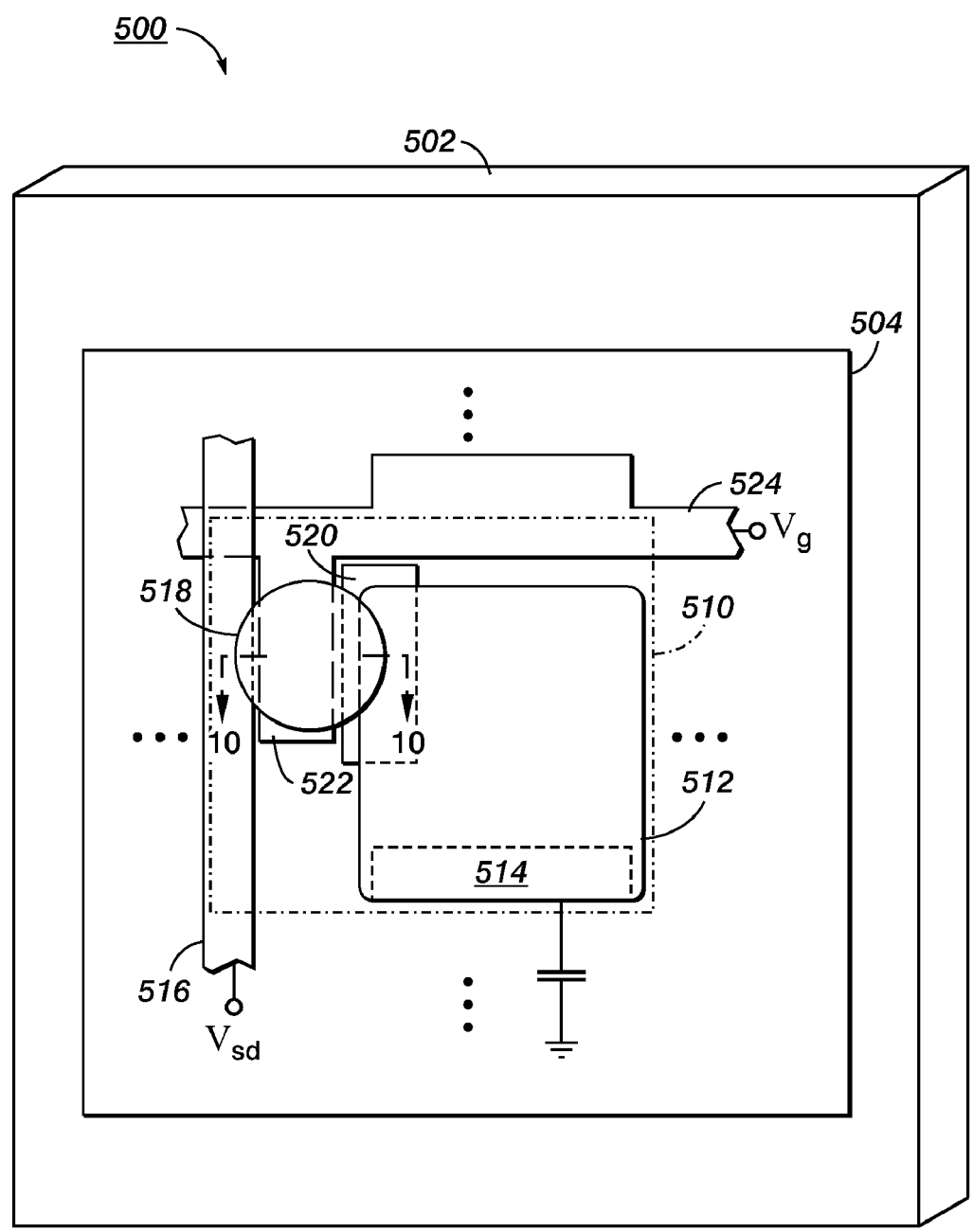
FIG. 9 is a schematic top view of an IC that includes a photosensing array.

FIG. 9 illustrates IC 500, an integrated structure that includes at least one substrate 502 and array 504, implemented with one or more of the features described above in relation to FIGS. 1-8. Array 504 includes an arrangement of cells, one or more of which could, for example, photosense light; in other implementations, a set of the cells could interact with light in other ways, such as by emitting light or by acting as a light valve. Such an IC could be implemented, for example, as a large-area visible or x-ray image sensor, and could be used in any of a wide variety of applications, such as in consumer electronics, medical imaging, inspection of structural components as in aircraft, security imaging as in airport luggage scanners, and so forth. IC 500 could be implemented, for example, with an active matrix TFT backplane and a photosensor layer. The active material in the TFTs and in the photosensor layer can include amorphous silicon (a-Si) or, as a low-cost alternative, organic polymer semiconductive material; a TFT with a channel that includes organic polymer material is sometimes referred to herein as an "organic TFT" or simply an "OTFT".

Various fabrication techniques could be used to produce IC 500. For example, with a-Si, metal layers can be deposited by sputtering, for example, and layers of dielectric and semiconductive materials can be deposited by plasma-enhanced chemical vapor deposition (PE-CVD). Organic polymer photosensor layers can, for example, be vapor deposited or dip-coated on a-Si backplanes, after which a top conductive layer can be deposited; alternatively, a patterned sheet with organic polymer photosensor and a top conductive layer can be laminated onto an a-Si or OTFT backplane. An OTFT backplane with organic polymer channels can be produced by vapor depositing and then patterning semiconductive organic polymer material.

Substrate 502 could, for example, be glass, plastic, or another insulating material suitable for microfabrication of electronic components on its surface. For rigidity, substrate 502 could be implemented with a rigid substrate such as glass. For flexibility, substrate 502 (and any other substrates in IC 500) could be implemented with mechanically flexible plastic material and each layered structure could be implemented with suitably thin inorganic layers to reduce mechanical stresses on the substrate(s). Further, a thin inorganic layer on the substrate could operate as a moisture barrier, protecting the substrate.

Although a-Si can be processed on a glass substrate with high temperatures, most currently available flexible substrates are susceptible to damage at high temperatures, and may require deposition processes at low temperatures, such as not exceeding approximately 200 degrees C. or another appropriate limit. More specifically, substrate 502 could be a "low-temperature substrate", meaning a substrate that is damaged if exposed to temperatures that are reached during some microfabrication processes, with the specific temperature above which damage occurs being determined by substrate material(s) and semiconductor material(s) and typically being available from a manufacturer's specifications for its materials; a low-temperature plastic substrate made of Kapton® would be typically damaged by temperatures in excess of 300 degrees C., but many plastic substrates would be damaged by temperatures in excess of lower temperatures, with some damaged by temperatures as low as 150 degrees C., and so forth.

Substrate 502 could also be a "mechanically flexible substrate", meaning a substrate that has sufficiently small thickness that it can be flexed in lateral directions, i.e. directions approximately perpendicular to its thickness direction. An example of a mechanically flexible substrate that is advantageous due to low surface roughness is polyethylene napthalate. If sufficiently flexible, for example, substrate 502 could be rolled up, such as for roll-to-roll processing or web processing, in which case substrate 502 might be a large area substrate, such as a few meters in width and many meters in length.

The above are merely illustrative examples of materials, substrates, fabrication techniques and parameters, and so forth. Various other specific examples are described below in relation to exemplary implementations, and it is foreseeable that techniques described herein could be implemented with various future-developed materials, substrates, fabrication techniques and parameters, and so forth.

Array 504 could be one of several arrays fabricated on substrate 502. Within array 504, illustrative cell 510 is shown as an area of array 504 within which a transistor structure is connected to cell electrode 512. In the illustrated example, cell electrode 512 could, for example, operate as an electrode of a capacitive component, with extension 514 of an adjacent gate line (not shown) operating as the other electrode.

Electrical connection of cell electrode 512 to conductive line 516 can be controlled by controlling conductivity of a channel in layer part 518, part of a layer of semiconductive material. Layer part 518 extends between two connecting points, at one of which it is electrically connected to electrode 512, such as through channel end electrode 520, and at the other of which it extends over and is electrically connected to a part of line 516, which operates as its other channel end electrode. Layer part 518 thus includes a channel portion whose conductivity is controlled by bottom gate electrode 522, an extension of conductive line 524 so that signals on line 524 control conductivity of the channel portion by changing voltage on electrode 522. As a result, line 516 can provide signals to and/or receive signals from cell electrode 512 when the channel portion is conductive due to signals on line 524.

Although layer part 518 illustratively includes only one FET in which conductivity of a channel portion is controlled by electrode 522, a wide variety of other transistor structures could be used in cell 510. For example, transistor structures for CMOS image sensors have been proposed with various combinations of channels, sometimes referred to as "1T" if one channel, "2T" if two, and so forth. Similarly, multiple channel transistor structures have been proposed for each cell of an active matrix array, such as for displays and other light transmissive, sensing, or emitting applications.

Figure 10:
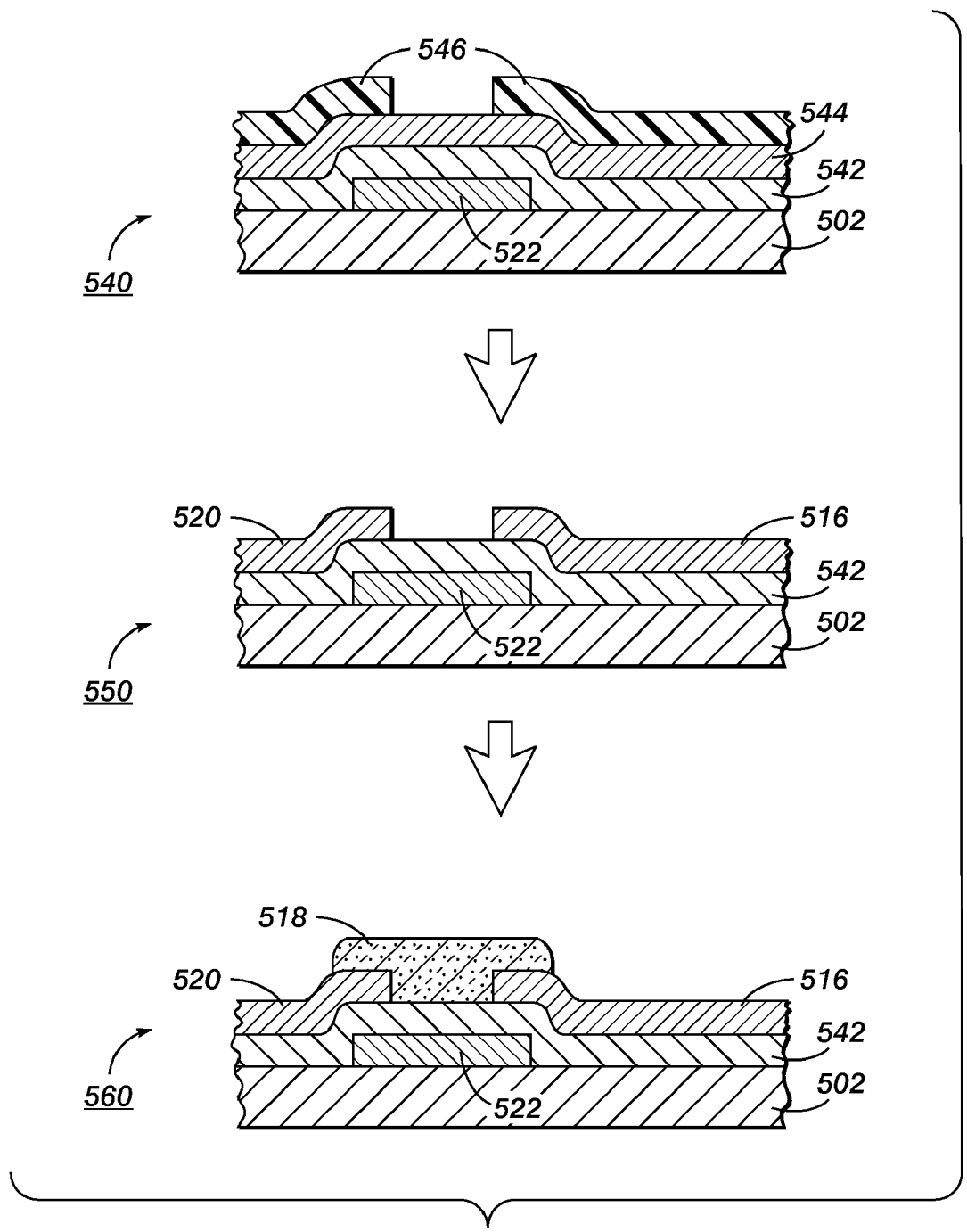
FIG. 10 shows a sequence of cross sections in producing an organic thin film transistor (OTFT) for an IC as in FIG. 9, taken along the line 10-10 in FIG. 9.

FIG. 10 shows a sequence of cross sections illustrating stages in producing active layers of IC 500, but with layer thicknesses not to scale. More particularly, the illustrated stages show production of a bottom gate transistor structure with channel end electrodes under a semiconductive layer that includes a channel portion. Additional stages before, after, and during the illustrated stages could be performed using any suitable operations, and it is foreseeable that additional and alternative operations for producing an IC with features as in FIG. 9 will be developed in the future.

Cross section 540 shows gate electrode 522 on substrate 502, with additional layers deposited over electrode 522. As noted above, substrate 502 could be any suitable insulating substrate material, such as glass, plastic, and so forth. In some implementations described herein, substrate 502 is a mechanically flexible, large area, low-temperature substrate material, such as a polymer layer or a very thin silicon nitride layer on top of a polymer layer, for example. Currently available candidate polymer materials include polyethylene napthalate, polyimide (for example Dupont Kapton® and others), polyester, and so forth, and it is foreseeable that other suitable substrate materials will be developed that could be used within the scope of the invention.

Gate electrode 522 can be printed, photolithographically patterned, or otherwise patterned directly on or over substrate 502 or another suitable support surface in one or more layers with an appropriate thickness using any suitable conductive material, such as chromium, aluminum, or other highly conductive metal or metal alloy, doped semiconductive material, a conductive combination of materials, or, if printed such as by jet printing, any suitable nanoparticle metal. It might also be possible to apply the techniques described herein to a bottom gate transistor structure with a semiconductor substrate in which the bottom gate is a heavily doped region, such as a p-type region of a silicon substrate, with a highly conductive back contact such as gold.

Gate dielectric layer 542 is illustratively on gate electrode 522, and could be implemented in any way consistent with a bottom gate transistor. For example, gate dielectric 542 can be implemented by depositing one or more layers of any suitable dielectric material or dielectric combination of materials on or over gate electrode 522 and other gate electrodes in array 504. Any of a wide variety of dielectric materials could be used, with an oxide or nitride of silicon (e.g. $SiO_2$ or $Si_3N_4$) being suitable, for example, if gate electrode 522 is chromium and with aluminum oxide ($Al_2O_3$) being suitable, for example, if gate electrode 522 is aluminum. Also, if printed such as by jet printing, gate dielectric layer 542 could include a suitable organic polymer dielectric. In general, gate dielectric layer 542 should be produced in such a way that its upper surface is suitable for subsequent production of the layered structure over it.

An active layered structure or substructure is then fabricated on gate dielectric layer 542, illustratively by depositing conductive layer 544 and then depositing and patterning a layer of resist to produce patterned layer parts 546. Conductive layer 544 can, for example, be a highly conductive material such as gold, deposited using sputtering or other suitable techniques, currently available or hereafter developed. The resist layer can similarly be any currently available or hereafter developed resist material, such as a photolithographically patterned photoresist material or a printed resist material.

Cross section 550 shows the result of then etching away exposed portions of layer 542, such as with a suitable wet etchant, and then removing layer parts 546, such as with a solvent, leaving conductive line 516 and channel end electrode 520 on gate dielectric layer 544. Alternatively, conductive line 516 and channel end electrode 520 could be produced by printing, such as by jet printing a suitable nanoparticle metal.

Cross section 560 shows the result of then producing semiconductive layer part 518 over the exposed portion of gate dielectric layer 542 between conductive line 516 and electrode 520. Layer part 518 could, for example, be a suitable organic polymer semiconductive material, printed such as by jet printing, in which case the active layers would include an OTFT. Organic polymer materials that have been successfully used in such implementations include polythiophenes, e.g. poly(3,3'''dialkylquaterthiophene) (PQT-12), and co-polymers, e.g. poly(2,5-bis(3-dodecylthiophen-2-yl) thieno[3,2-b]thiophene) (PBTTT), and it is believed that various other currently available or future-developed organic polymers could be used. Alternatively, layer part 518 could be produced by photolithographic patterning of an appropriate semiconductive material, such as a-Si, and suitable backplanes for one or more of the techniques in FIGS. 1-8 could include various other geometries; for example, each of conductive line 516 and channel end electrode 520 are illustratively under an end region of layer part 518 but could be positioned in various other ways to provide electrical connections to ends of a channel portion, such as on layer part 518 or somehow abutting it, provided fabrication constraints are not violated. Furthermore, although conductive line 516 both operates as a data line and also includes a region that operates as a channel end electrode, a layer part separate from line 516 could operate as the channel end electrode.

Techniques as in FIG. 10 have been successfully implemented to produce OTFTs and OTFT backplanes. Compatible combinations of materials mentioned above have been found. It is foreseeable, however, that various other techniques for producing OTFTs and OTFT backplanes, such as with other combinations of materials, will be developed in the future, and use of such techniques would be within the scope of the invention. Furthermore, as noted above, inorganic semiconductive materials could also be used within the scope of the invention.

Figure 11:
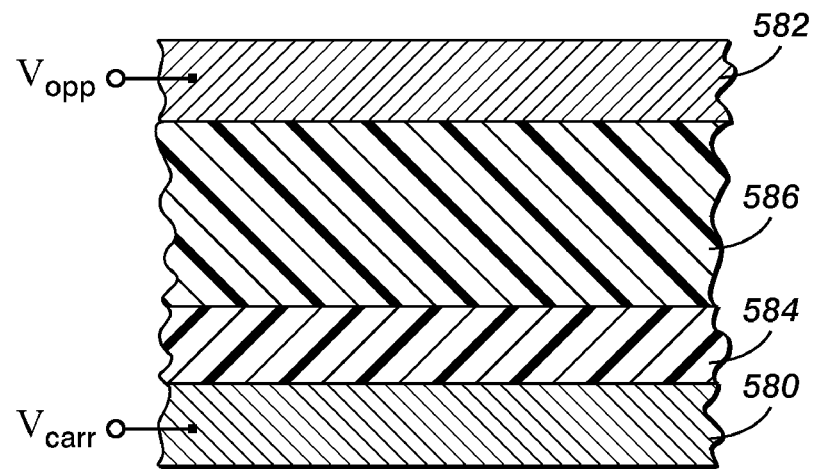
FIG. 11 is a partially schematic cross section of a general photosensor structure that can be used in an IC as in FIG. 9.

FIG. 11 illustrates in cross section general features of exemplary photosensor structures that can be used in any of a number of different ways to implement IC 500 (FIG. 9). At least one of electrode layers 580 and 582 is light transmissive, and can be a transparent conductive material such as indium-tin-oxide ITO; other examples of materials for electrode layers 580 and 582 are mentioned in relation to exemplary implementations described below. Adjacent electrode layer 580 is charge generation layer (CGL) 584, in which, in response to incident light, absorbs photons resulting in free charge carriers. Between CGL 584 and electrode layer 582 is charge transport layer (CTL) 586, which operates to split charge carrier pairs from CGL 584 and to transport charge carriers of one type from CGL 584 toward electrode 582 in response to an electric field, resulting in a photocurrent. The electric field is produced by applying a voltage across electrode layers 580 and 582 to facilitate charge separation and transport.

Various materials could be used to implemented CGL 584 and CTL 586 in photosensor structures as in FIG. 11. For an implementation in which holes from CGL 584 are split from charge carrier pairs and transported through CTL 586, for example, CGL 584 can include a dispersion of an organic polymer photoconductor in a binding matrix, e.g. a titanyl phthalocyanine in poly(vinylbutyral); a single organic photoconductor, such as poly(9,9-dioctylfluorene-alt-benzothiadiazole) (F8BT) or another polyfluorene; or another semiconductive organic polymer or blend. Also, CTL 586 can be a hole transport layer that includes a conductive polymer material, such as N,N'-diphenyl-N,N'bis(3-methylphenyl)-(1-1'-biphenyl)-4,4'-diamine (TPD), dispersed in an insulating matrix such as polycarbonate, or an electron transport layer that includes a conductive organic material such as alkylated-4,4'diphenoquinones (DPQ) dispersed in an insulating matrix such as polycarbonate.

Figure 12:
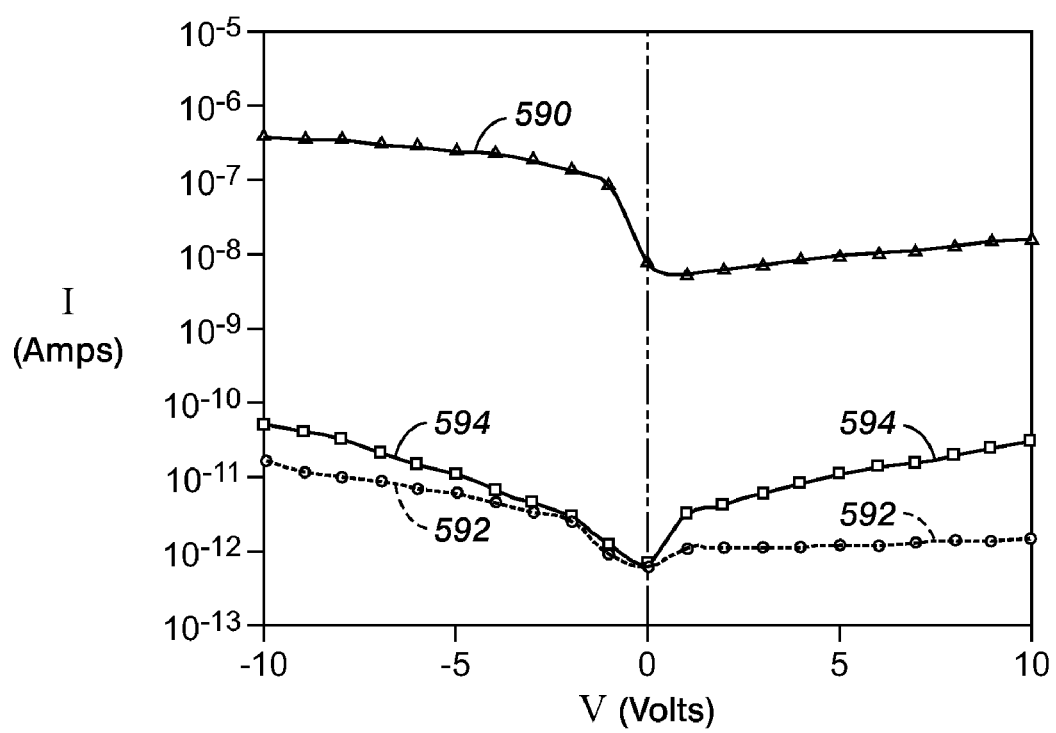
FIG. 12 is a graph showing photocurrent and dark current as a function of voltage across exemplary structures as in FIG. 11.

The graph in FIG. 12 illustrates photoresponse measured for prototype organic polymer photosensors similar to the structure in FIG. 11, but with electrode layer 580 of chromium, CGL 584 of F8BT, CTL 586 of TPD in polycarbonate, and electrode layer 582 of gold. The bandgaps of these materials allow electrons from CGL 584 to enter electrode layer 580, while holes from CGL 584 are transported through CTL 586 to electrode layer 582.

In FIG. 12, each plotted line shows current I between electrode layers 580 and 582 as a function of voltage difference V between layers 580 and 582. Plotted line 590 shows photocurrent, i.e. the current in response to light, while plotted line 592 shows current in darkness immediately after fabrication and plotted line 594 shows current in darkness six days after fabrication. As can be seen, the dark current remained sufficiently separated from the photocurrent to maintain a relatively high signal to noise ratio.

Figure 13:
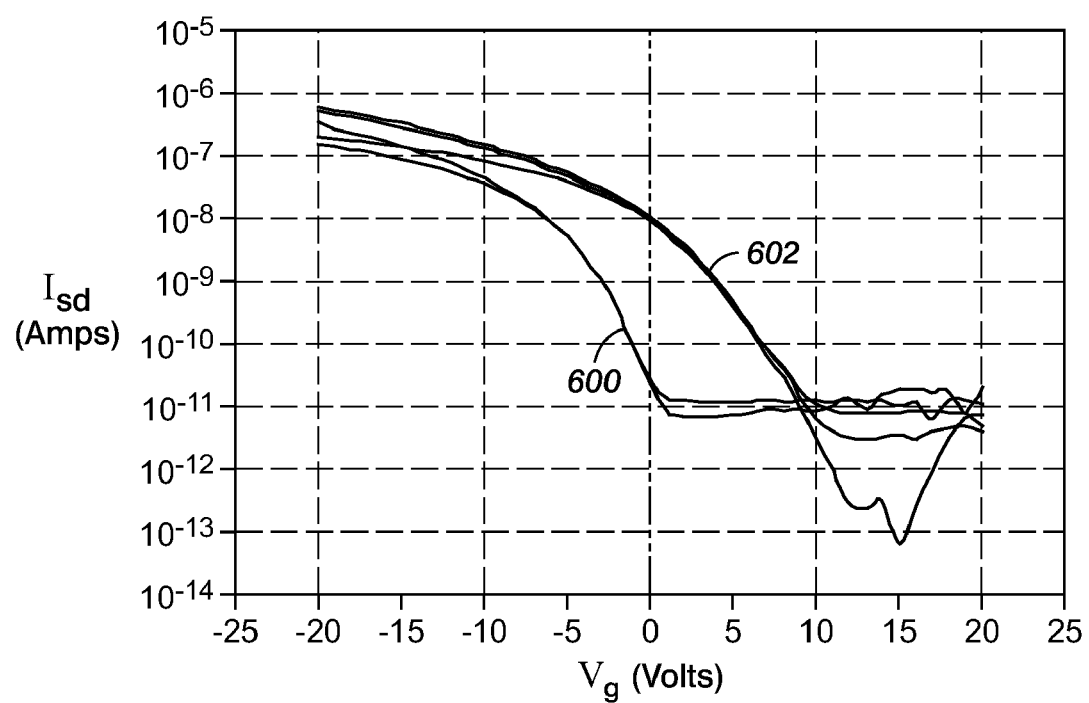
FIG. 13 is a graph showing source-drain current in OTFTs as in FIG. 10 as a function of gate voltage, before and after spin-coating with a charge transport layer as in FIG. 11.

The graph in FIG. 13 shows source-drain current as a function of $V_g$ for finished OTFTs with PQT-12 channels before and after spin-coating with a layer of TPD in polycarbonate (TPD/PC). Curves 600 show source-drain current of OTFTs before spin-coating of TPD/PC, while curves 602 show source-drain current after spin-coating. Small shifts in Von and sub-threshold slope are shown, probably due to exposure of OTFTs to ambient atmosphere during spin-coating; similar behavior has been observed for spin-coating of inert materials such as PMMA without a hole transport layer, and it is believed that spin-coating in a clean, dry atmosphere or post-annealing will mitigate this effect. More generally, the curves in FIG. 13 show that the layer of TPD in polycarbonate is acceptable because proper switching of OTFTs is observed when the layer is deposited directly on their organic polymer channels. An added advantage is that the layer of TPD in polycarbonate can act as a protecting or encapsulating layer for the OTFTs.

The result shown in FIG. 13 shows that direct contact between TFT and TPD is acceptable. Such structures are simpler than structures typically used for a-Si TFTs, which include both an encapsulation and a via layer to separate active sensor layers from the TFT backplane. The result shown in FIG. 13 might result from confinement of charge carriers at the bottom of the semiconducting polymer in the OTFT's channel and also from the energetic mismatch of the two materials—the TPD is a wider gap material than the semiconductive polymer in the channel so there is little chance for hole trapping due to the TPD. It is possible to use this result to design layered photosensor structures that implement techniques described above in relation to FIGS. 1 and 2.

FIGS. 14-19 show exemplary implementations of features described in relation to FIGS. 1-6 above in ICs as in FIGS. 9-11. Except as otherwise noted, layers and layer parts in FIGS. 14-19 are labeled with the same reference numerals as in FIGS. 9-11 and can be similarly implemented.

Figure 14:
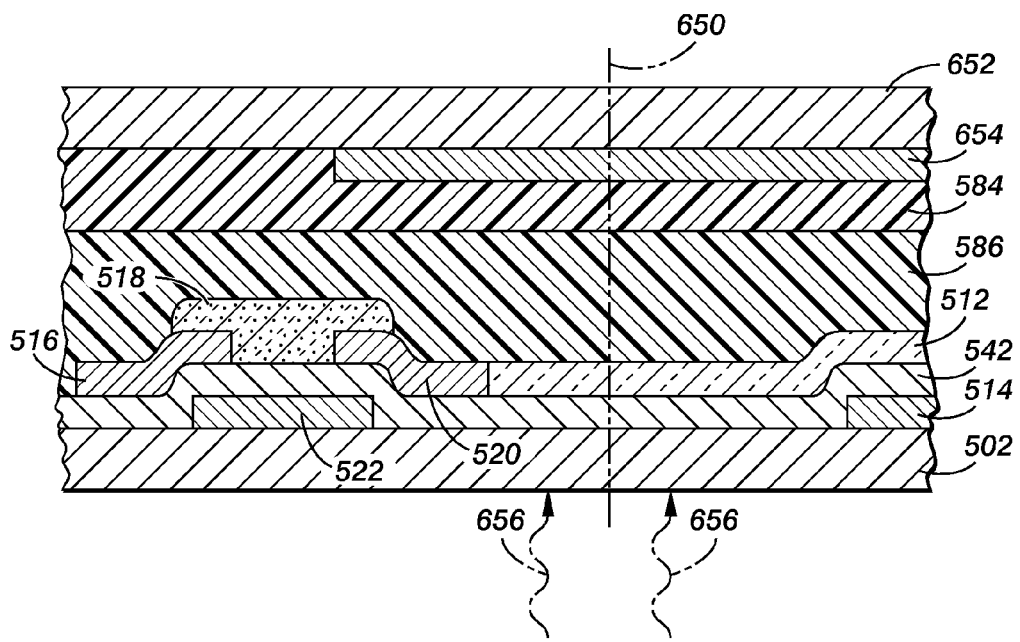
FIG. 14 is a partially schematic cross section of a cell region in one exemplary implementation of an IC as in FIG. 9.
Figure 15:
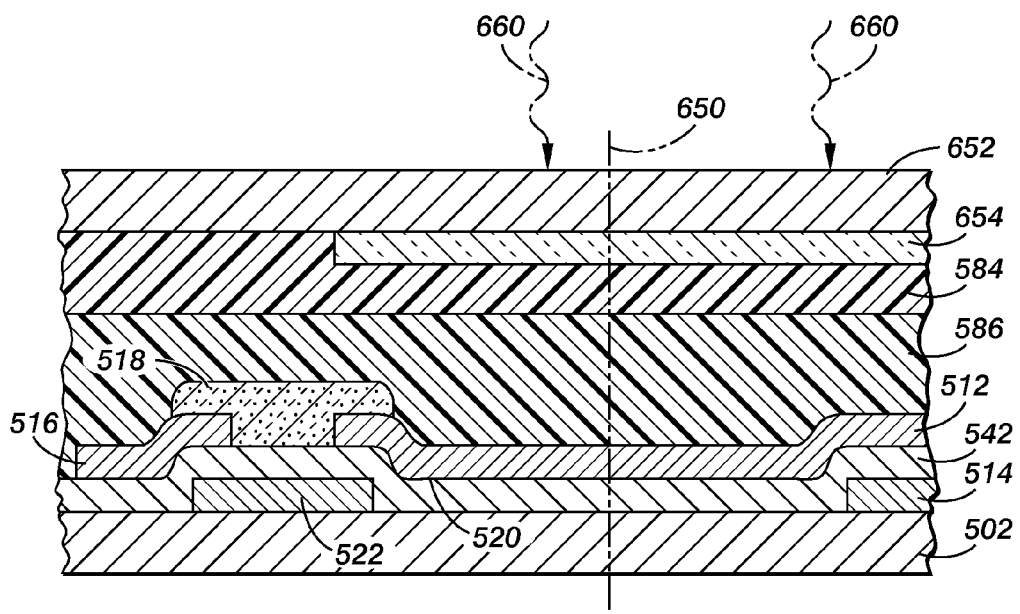
FIG. 15 is a partially schematic cross section of a cell region in another exemplary implementation of an IC as in FIG. 9.
Figure 16:
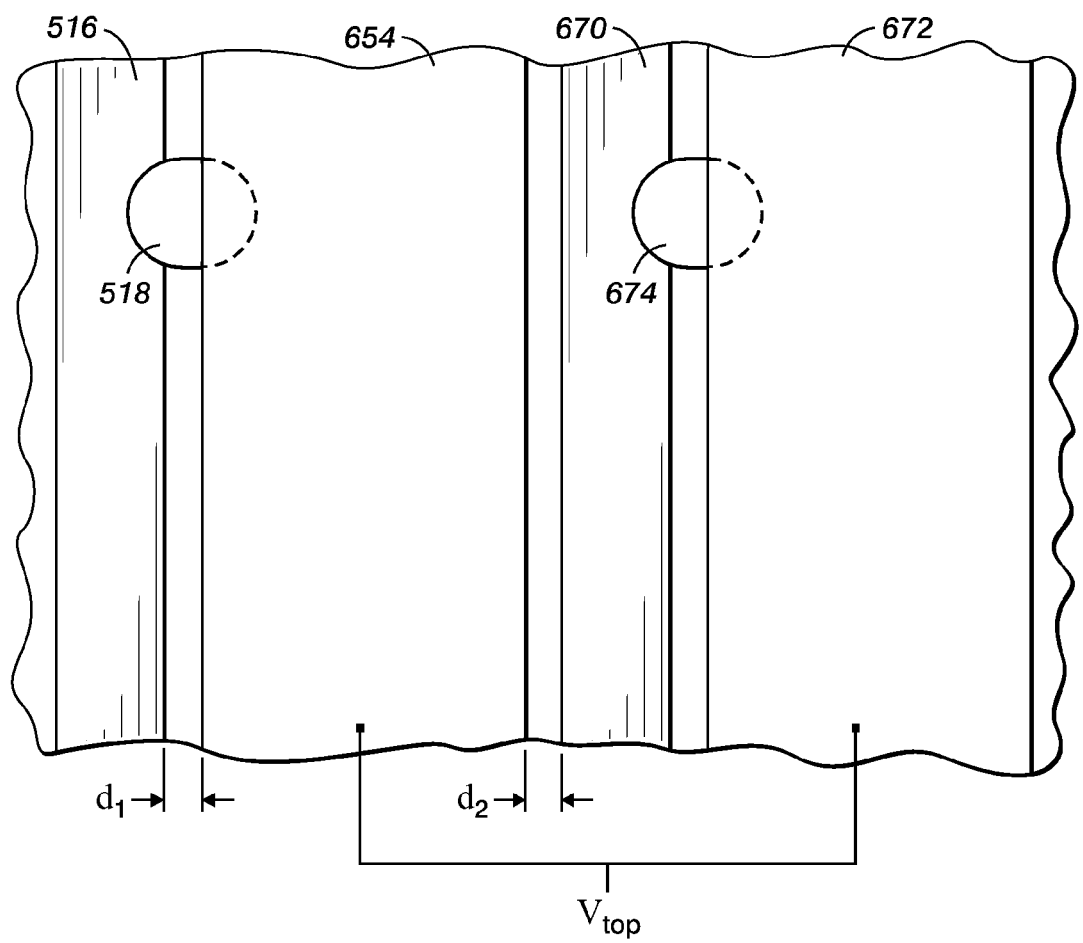
FIG. 16 is a top plan view of top electrode strips and data lines in a layout that can be used in implementations as in FIGS. 14 and 15.

The exemplary implementations in FIGS. 14-16 are related: FIG. 14 illustrates a cell region that can perform photosensing in response to illumination through the OTFT backplane substrate, also referred to as "back illumination"; a cell region as in FIG. 14 is sometimes referred to herein as an "inverted pixel". FIG. 15 illustrates a cell region that can perform photosensing in response to illumination through a top electrode, also referred to as "top illumination". FIG. 16 illustrates techniques for patterning top electrode layers in implementations as in FIGS. 14 and 15.

The cross sections in FIGS. 14 and 15 are similar to those in FIG. 10, but taken in the opposite direction or taken of cell regions that are mirror images or other variations of the cell region in FIGS. 9 and 10, with conductive line 516 at left and channel end electrode 520 at right in the OTFT. Also, the cross sections of FIGS. 14 and 15 include electrode 514 at far right, which could be seen in cross sections of the cell region of FIGS. 9 and 10 if each cross section makes a bend at intersecting line 650.

In FIG. 14, cell electrode 512 is a light-transmissive or transparent conductive material such as ITO or a conductive carbon nanotube (CNT) material. As shown, cell electrode 512 meets and is electrically connected to channel end electrode 520, and is therefore electrically connected to conductive line 516 when the channel in layer part 518 is conductive. CTL 586 is on the exposed surfaces of electrodes 512 and 520, layer part 518, and conductive line 516, while organic polymer CGL 584 is on CTL 586. In the illustrated implementation, substrate 652 at the top can be made of glass, plastic, or other suitable material, and top electrode 654 can be part of a patterned layer of conductive material on substrate 652, such as a photolithographically or digital lithographically patterned layer or a printed layer of aluminum or chromium.

In operation, incident light, illustrated by rays 656, enters through substrate 502, passes through gate dielectric layer 542 (or possibly through a patterned opening in layer 542, e.g. if it is opaque), electrode 512, and CTL 586, and is absorbed in CGL 584, producing charge carrier pairs. CTL 586 operates to separate free charge carriers and transport them from CGL 584 toward electrode 512, producing photocurrent that either increases or decreases stored charge in a capacitive component that includes parts of electrodes 512 and 514. In general, the magnitude of stored charge therefore indicates intensity of illumination at the location of the illustrated cell region, and can therefore be read out through conductive line 516 by turning on the OTFT in accordance with suitable array readout techniques, including CMOS readout techniques and other currently available techniques and also foreseeably including future developed readout techniques.

In FIG. 14, layer part 518, which includes the OTFT's channel, is protected from illumination by opaque gate electrode 522, which therefore acts as a light shield. This shielding effect is beneficial for OTFTs implemented with semiconductor material that has a large photoresponse. Also, CTL 586 can be implemented with a small-molecule polymer dispersed in an insulating matrix and deposited over layer part 518 during fabrication, and can therefore provide environmental encapsulation for organic polymer semiconductor in layer part 518 during subsequent processes.

In FIG. 15, cell electrode 512 is integrally formed with electrode 520 in the same layer of conductive material, and is therefore similarly electrically connected to conductive line 516 when the channel in layer part 518 is conductive. Other layers are as in FIG. 14, except that top electrode 654 is a light-transmissive or transparent conductive material such as ITO or conductive CNT material, again part of a patterned layer on substrate 652, with direct jet-printing being appropriate if transparent conductors such as CNT dispersions are available.

In operation of the cell region in FIG. 15, however, incident light, illustrated by rays 660, enters through substrate 652, passes through top electrode 654, and is absorbed in CGL 584, producing charge carrier pairs. As in FIG. 14, CTL 586 operates to separate free charge carriers and transport them from CGL 584 toward electrode 512, producing photocurrent that either increases or decreases stored charge that can be read out as described above.

In FIG. 15, layer part 518, which includes the OTFT's channel, is less protected from illumination than in FIG. 14, except to the extent CGL 584 absorbs incident light. As in FIG. 14, CTL 586 can provide environmental encapsulation for organic polymer semiconductor in layer part 518.

FIG. 16 shows a top electrode pattern that can be used to implement ICs with cell regions as in FIGS. 14 and 15, also implementing some features described above in relation to FIGS. 3 and 4. CGL 584 and CTL 586 are not shown in FIG. 16 because they are not patterned and are therefore present throughout the illustrated area; certain other layers and layer parts are also omitted because not relevant to the illustrated features.

As in FIGS. 14-15, layer part 518 extends over and is electrically connected to conductive line 516 and top electrode 654, which is part of a top electrode strip extending in a lateral direction over a line of cell regions along and parallel to conductive line 516; as suggested by FIG. 16, the implementation includes a series of similarly shaped top electrode strips. Conductive line 670 is on the opposite side of electrode 654 from conductive line 516, on the other side of the same line of cell regions and between electrode 654 and adjacent top electrode strip 672. Similarly to layer part 518, semiconductive layer part 674 in an adjacent cell region extends over and is electrically connected to conductive line 670, but can also extend under top electrode strip 672. Like the strip that includes top electrode 654, top electrode strip 672 extends in a lateral direction over a line of cell regions along and parallel to conductive line 670.

In a photosensing array with layers like CGL 584 and CTL 586, a conductive path between a top electrode and a data line through CGL 584 and CTL 586, such as for photocurrent, degrades performance. In effect, noise on the data line increases, and the signal-to-noise ratio accordingly decreases. Gaps d1 and d2 in FIG. 16 illustrate one way to reduce this problem. If CGL 584 and CTL 586 are structured so that charge carriers are transported anisotropically as described above in relation to FIG. 2, and if neither adjacent top electrode extends over a data line, then the data line's signal-to-noise performance should not be reduced due to parasitic leakage of this kind. In some cases, anisotropy of carrier transport in CTLs can be controlled by modification of the composition of dispersed charge carrier in an insulating matrix.

In the technique of FIG. 16, adjacent top electrode strips in the series are separated by sufficient gaps that the gap between them equals at least the sum of (d1+d2) plus the maximum width of conductive lines 516, 670, and so forth. As a result of this relatively coarse patterning, alignment of top electrode strips with data lines is much simpler than if each cell region had a respective top electrode that was more precisely patterned to fit the cell region's area: The top electrode strips must be sufficiently close to parallel with the data lines that they do not extend over them and must also be registered in a direction perpendicular to the data lines so that each data line fits within the gap between adjacent top electrode strips while not being covered by either top electrode strip; both of these alignment issues can be made easier by increasing (d1+d2), i.e. by increasing the gap between adjacent top electrode strips so that its difference from the data line width is greater. Also, as suggested by the connections to $V_{top}$ in FIG. 16, the circuitry necessary to connect all top electrodes to the top electrode voltage, $V_{top}$, is simpler than if it were necessary to separately connect each cell region's top electrode to $V_{top}$.

Alignment as described above could be implemented in any suitable way during lamination, before, during, or after operations that move facing surfaces toward each other. For example, alignment might be performed visually by direct viewing or by viewing with aid of a camera and/or appropriate magnification. Alignment might be aided with appropriate markings on one or both substructures; in a simple example, a set of alignment marks on one substructure would be positioned in alignment with a set of alignment marks on the other.

Figure 17:
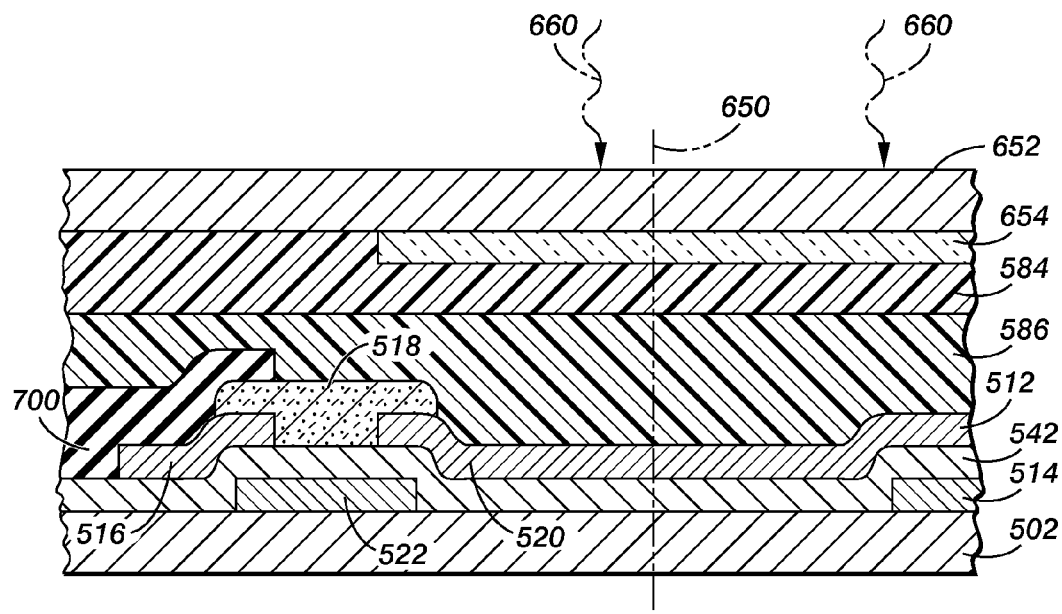
FIG. 17 is a partially schematic cross section of a cell region in another exemplary implementation of an IC as in FIG. 9.
Figure 18:
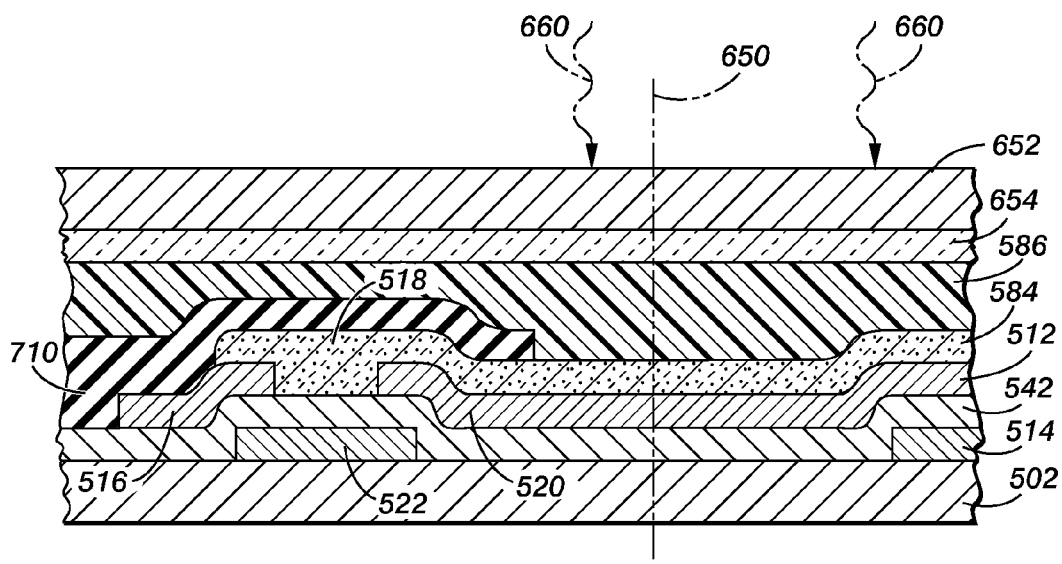
FIG. 18 is a partially schematic cross section of a cell region in another exemplary implementation of an IC as in FIG. 9.
Figure 19:
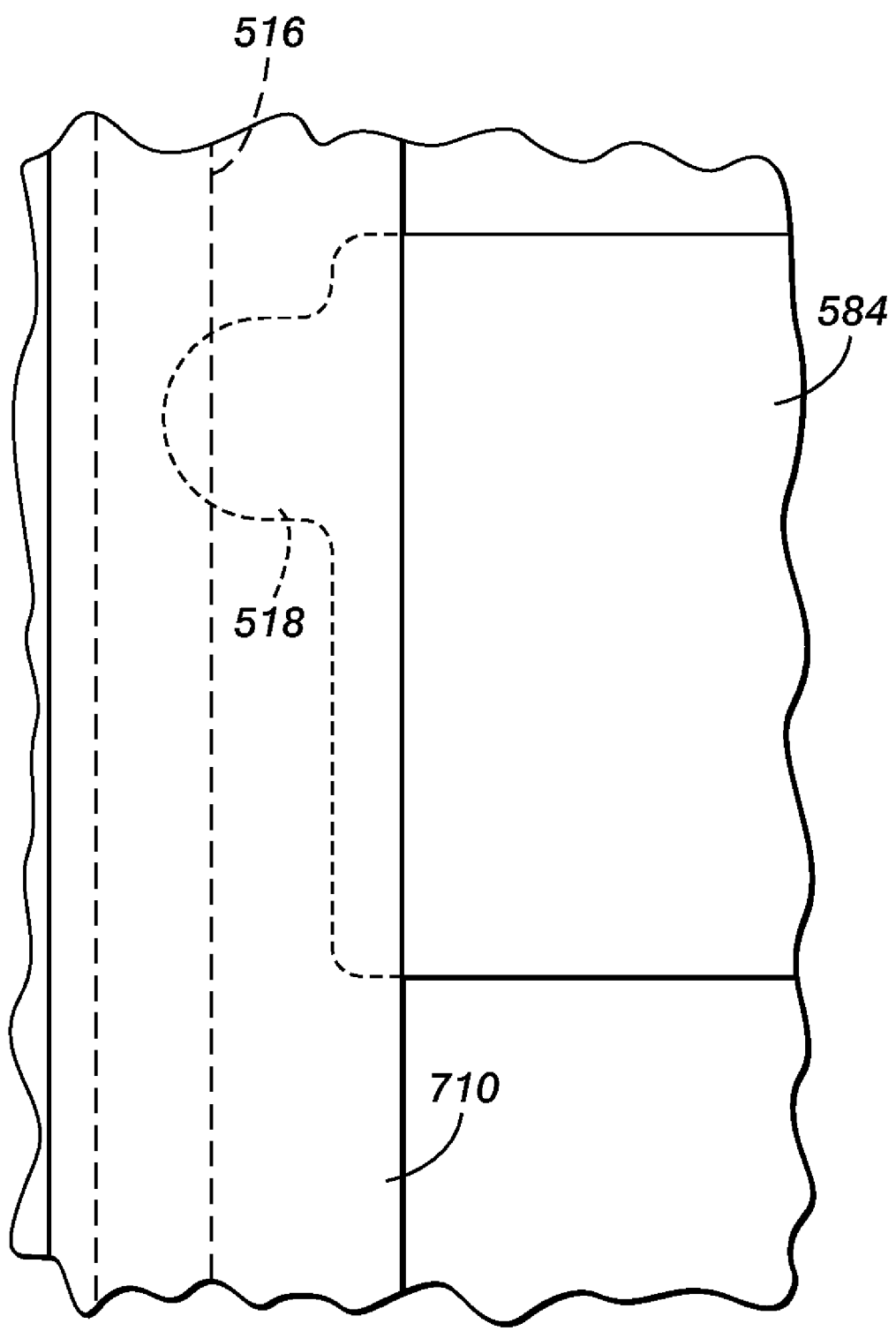
FIG. 19 is a top plan view of encapsulation over a data line and an OTFT channel in a layout that can be used in implementations as in FIG. 18.

The exemplary implementations in FIGS. 17-19 are also related: The cross sections in FIGS. 17 and 18 are taken along a line like that of FIG. 15, with FIG. 17 illustrating a cell region with encapsulation of conductive line 516 and FIG. 18 illustrating layer part 518 and cell electrode 522 implemented with the same semiconductive polymer material; in FIG. 18, encapsulation is extended to cover layer part 518. FIG. 19 illustrates techniques for patterning encapsulant in implementations as in FIG. 18.

In FIG. 17, which illustrates an example of features shown in FIGS. 1-4, encapsulant 700 extends over data line 516, preventing parasitic leakage current between top electrode 654 and data line 516. As shown, encapsulant 700 can be used together with the technique described above in relation to FIG. 15, or encapsulant 700 could be used with an unpatterned top electrode layer that extends over data line 516 if encapsulant 700 is sufficient by itself to prevent leakage current. Encapsulant 700 could be implemented as a patterned layer of dielectric material, photolithographically patterned or printed, such as a printable wax material of the type used for digital lithography or other printable dielectric polymer material.

In FIG. 18, which illustrates an example of features shown in FIGS. 3-6, layer part 518 and CGL 584 both include the same semiconductive polymer material, and therefore can, if appropriate, be formed in parallel such as by photolithography or in sequence during a single operation such as by printing. The semiconductive polymer material could, for example, be any of various semiconductive organic polymers that are available for TFT channels and that can operate as a CGL with an appropriate CTL. Layer part 518 could, for example, be a suitable organic polymer semiconductive material, printed such as by jet printing, in which case the active layers would include an OTFT. Organic polymer materials that are expected to be successful in such implementations include photoconductive polythiophenes, e.g. poly(3,3'''-dialkylquaterthiophene) (PQT-12), and photoconductive co-polymers, e.g. poly(2,5-bis(3-dodecylthiophen-2-yl)thieno[3,2-b]thiophene) (PBTTT), and it is believed that various other currently available or future-developed photoconductive organic polymers could be used. More generally, it may be possible to implement another light-interactive component rather than CGL 584 with the same semiconductive polymer material as layer part 518, or to implement two other types of subregions with the same semiconductive polymer material, with one subregion including a channel and the other being light-interactive.

In FIG. 18, opaque, electrically insulating encapsulant 710 can be implemented similarly to encapsulant 700 in FIG. 17, with a light absorbent dielectric material, patterned so that it extends not only over conductive line 516 but also over layer part 518, which includes the OTFT's channel, but not entirely over CGL 584. In this implementation, encapsulant 710 not only prevents leakage current between top electrode 654 and conductive line 516 but also acts as a light shield that protects the channel in layer part 518 from contact with CTL 586 and from incident light. Protection from incident light is necessary in such an implementation because using the same materials for TFT and CGL requires that the TFT be insensitive to light in order to be an acceptable switch for typical applications.

In operation of the cell region in FIG. 18, incident light, illustrated by rays 660, enters through substrate 652, passes through top electrode 654 and CTL 586, and is absorbed in CGL 584, producing charge carrier pairs. Similarly to FIG. 14, CTL 586 operates to separate free charge carriers and transport them from CGL 584 toward top electrode 654, producing photocurrent that either increases or decreases stored charge that can be read out as described above.

FIG. 19 shows an encapsulant pattern that can be used to implement ICs with encapsulant 710 as in FIG. 18. Top electrode 564 and CTL 586 are not shown in FIG. 19 because they are not patterned and are therefore present throughout the illustrated area; certain other layers and layer parts are also omitted because not relevant to the illustrated features.

Similarly to FIG. 16, layer part 518 extends over and is electrically connected to conductive line 516, but both are shown in dashed line in FIG. 19 because both are under encapsulant 710. The patterned layer of semiconductive polymer material that includes layer part 518 also includes, however, CGL 584, which illustratively connects to layer part 518 and extends from there out from under encapsulant 710, so that it can receive incident light from top illumination even though the channel in layer part 518 is protected from incident light. Encapsulant 710 extends in a lateral direction over conductive line 516, covering the channels of OTFTs in a line of cell regions along conductive line 516. This geometry avoids the need to pattern encapsulant 710 separately for each cell region.

Figure 20:
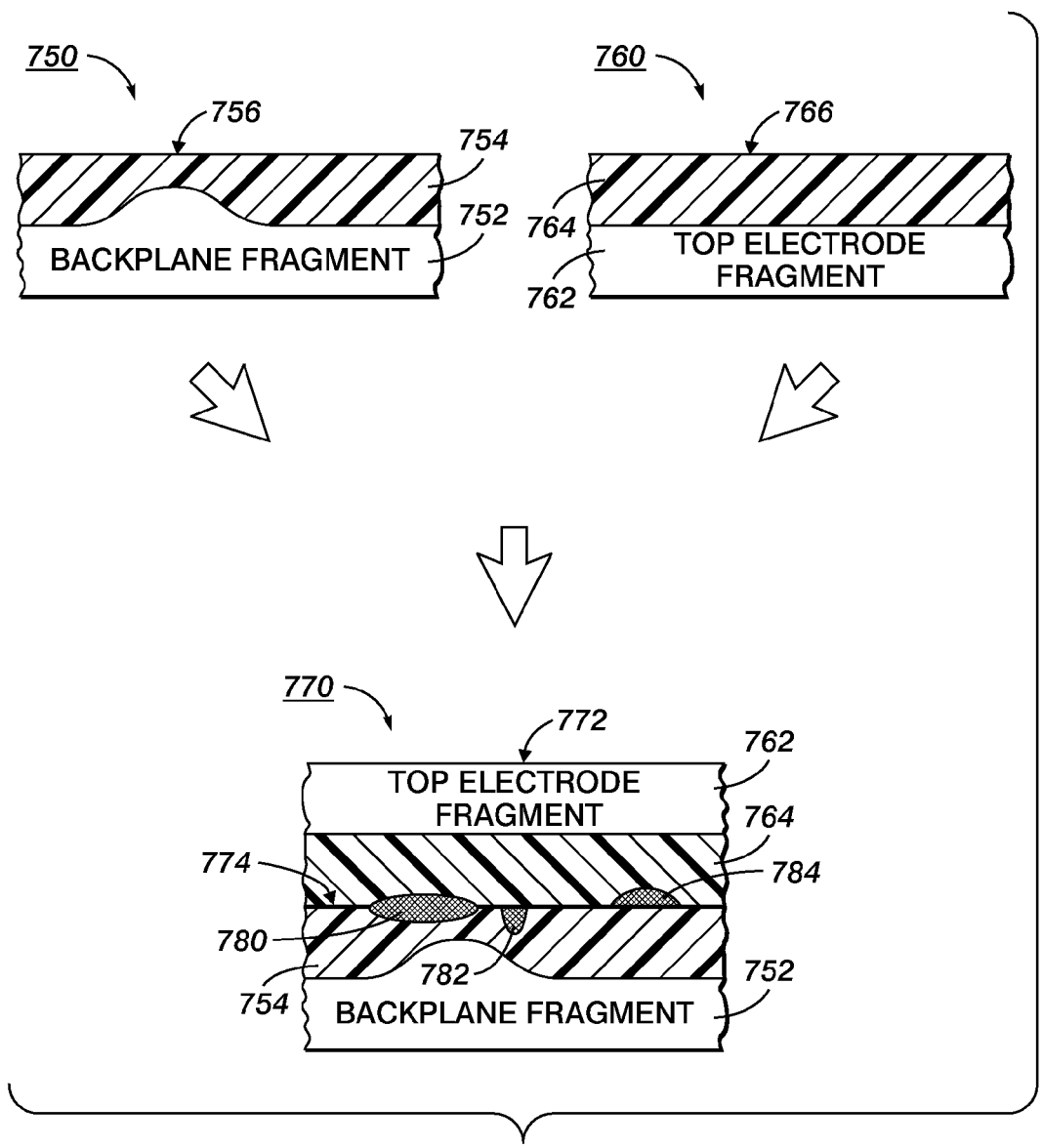
FIG. 20 shows cross sections in a lamination technique that can be used to produce an IC as in FIG. 9.
Figure 21:
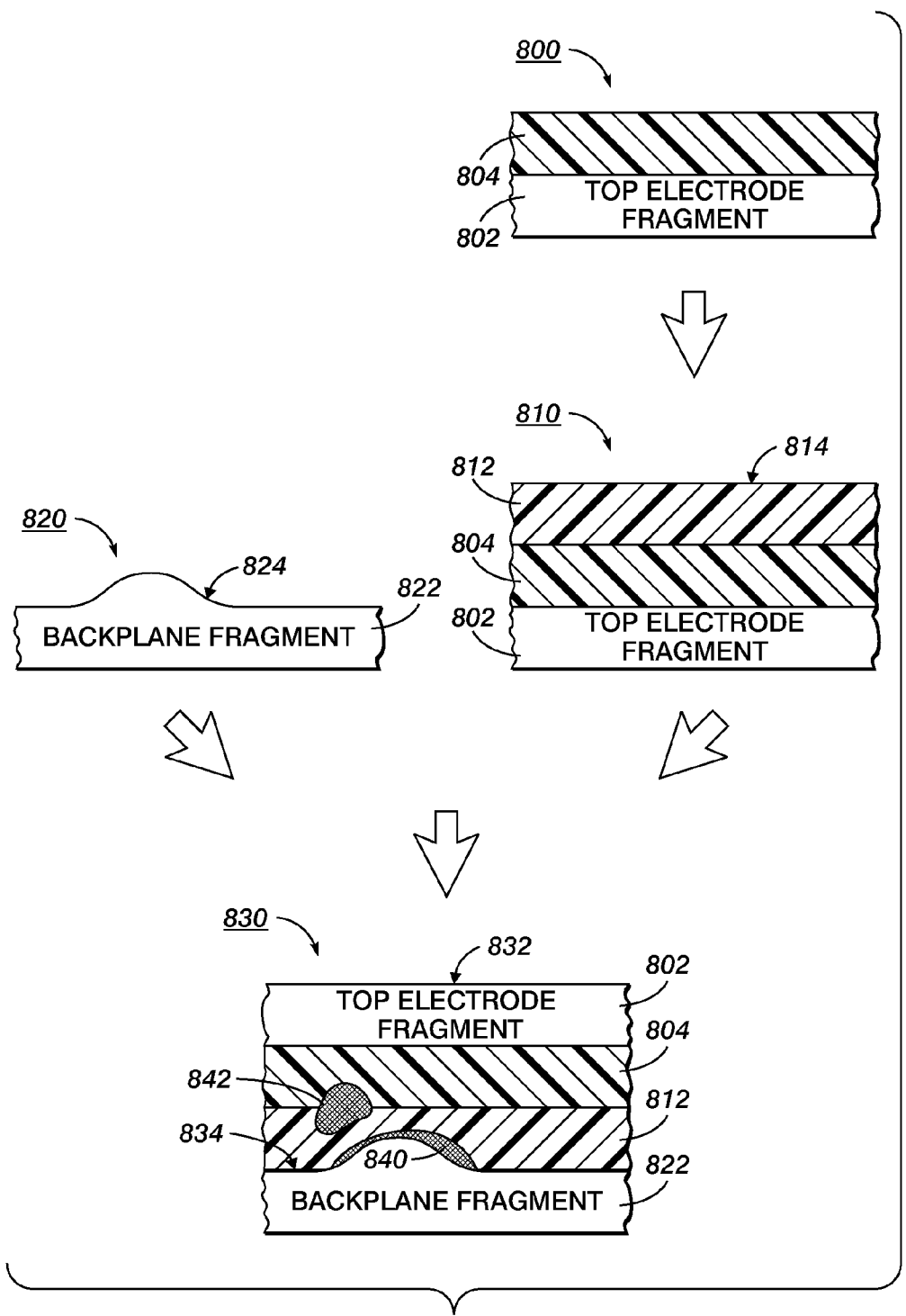
FIG. 21 shows cross sections in another lamination technique that can be used to produce an IC as in FIG. 9.
Figure 22:
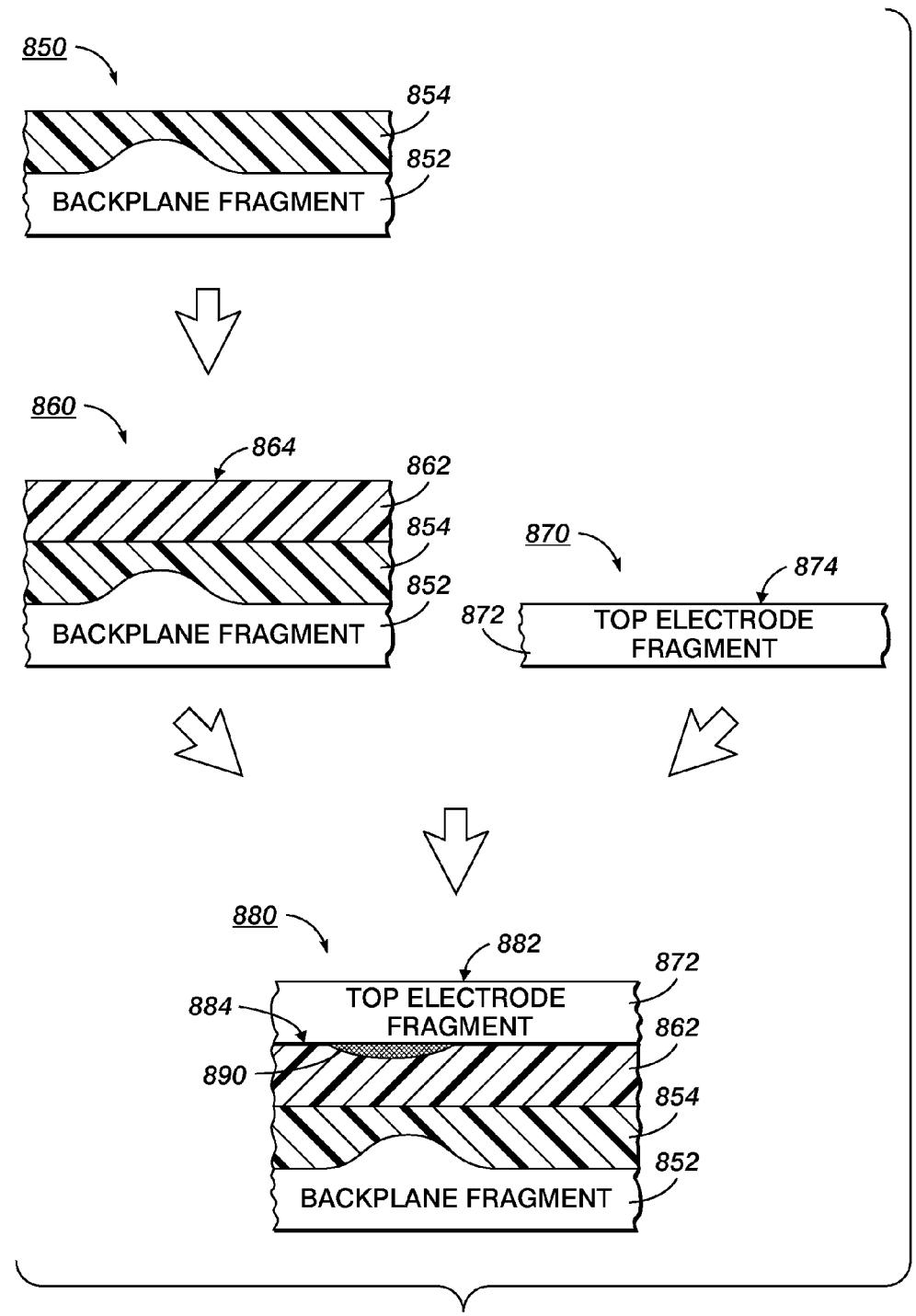
FIG. 22 shows cross sections in another lamination technique that can be used to produce an IC as in FIG. 9.

FIGS. 20-22 illustrate lamination techniques that can, with suitable modifications, be used to produce ICs as described above in relation to FIGS. 9-19. The techniques in FIGS. 20-22 are also examples of how features in FIGS. 7-8 can be implemented.

In the lamination technique of FIG. 20, surfaces of two polymer-containing layers meet at an interface surface. The two polymer-containing layers are produced separately before lamination such as by solution processing, and lamination artifacts of various kinds could occur on either of the polymer-containing layers, such as at the interface surface, or in either of the polymer-containing layers.

As shown in cross section 750, backplane fragment 752, shown in outline for generality, is from an IC with an array in which cell regions include OTFTs. Such an IC could be implemented in any of the ways described above or in other suitable ways. Polymer-containing layer 754 has been produced over backplane fragment 752, such as by spin-coating or dip-coating a CTL, a CGL, or part of a CTL. Alternatively, a xerographic CTL or CGL in sheet form could be laminated onto backplane fragment 752 to produce layer 754. In any case, layer 754 has surface 756 suitable for lamination.

As similarly shown in cross section 760, top electrode fragment 762, also shown in outline for generality, could be implemented in any of the ways described above or in other suitable ways. Polymer-containing layer 764 has been produced over top electrode fragment 762, such as by spin-coating or dip-coating a CGL, a CTL, or another part of a CTL where part of the CTL has already been spin-coated on backplane fragment 652. Alternatively, a xerographic CGL or CTL in sheet form could be laminated onto top electrode fragment 762. Like layer 754, layer 764 has surface 766 suitable for lamination.

Cross section 770 shows the result of lamination, in which IC fragment 772 includes backplane fragment 752, top electrode fragment 762, and both of polymer-containing layers 754 and 764. In this implementation, interface surface 774 occurs where surfaces 756 and 766 meet, between layers 754 and 764.

Lamination artifact 780 is illustratively on or in both of layers 754 and 764, while lamination artifact 782 is on or in only layer 754 and lamination artifact 784 is on or in only layer 756. These artifacts could, for example, be changes in shape, texture, or composition that result from application of increased pressure and/or temperature during lamination, or other changes in the structures of layers 754 and 756 indicating that they are in contact due to lamination rather than being coated or otherwise deposited one on the other. As used herein, a lamination artifact is "on or in" a layer if all or any part of the lamination artifact is at a surface of the layer, inside the layer, or both.

The term "artifact of contact pressure" refers herein to artifacts that result at least in part from pressure between two surfaces that meet during lamination, while "artifact of heat" refers to artifacts that result at least in part from increased temperature of two surfaces that meet during lamination; also, "artifact of surface shape" refers to artifacts that result at least in part from differences in shape of two surfaces that meet during lamination, such as differences in thickness. A given artifact could be one or more of these types and another type; for example, artifact 780 could be both an artifact of contact pressure and an artifact of heat.

Artifacts 780, 782, and 784 are all "surface artifacts", in the sense that they are spatially isolated at a surface where a polymer-containing layer meets another layer, in this case interface surface 774. Given that useful polymer-containing layers are generally flexible during fabrication, it is expected that lamination as described above is more likely to produce surface artifacts than to produce "sub-surface artifacts", i.e. artifacts that are in a polymer-containing layer but spaced away from a surface at which the layer meets another layer.

In the lamination technique of FIG. 21, a surface of a polymer-containing layer meets a surface of a backplane at an interface surface. Polymer-containing layers are produced on top electrode layers before lamination, such as by solution processing, and lamination artifacts of various kinds could occur at the interface surface or in the polymer-containing layer whose surface meets the backplane surface.

As shown in cross section 800, top electrode fragment 802 has polymer-containing layer 804. Layer 804 could be produced on top electrode fragment 802, such as by spin-coating, dip-coating, or laminating a CGL or a CTL. As shown in cross section 810, polymer-containing layer 812 has been produced on layer 804, again such as by spin-coating, dip-coating, or laminating a CTL or a CGL. As an alternative, layers 804 and 812 could be concurrently laminated to fragment 802 in sheet form. In any case, layer 812 has surface 814 suitable for lamination.

As shown in cross section 820, backplane fragment 822 does not have a polymer-containing layer over its surface 824 prior to lamination. But surface 824 must be suitable for lamination with surface 814.

Cross section 830 shows the result of lamination, in which IC fragment 832 includes backplane fragment 822, top electrode fragment 802, and both of polymer-containing layers 804 and 812. In this implementation, interface surface 834 occurs where surfaces 814 and 824 meet, between layer 812 and the backplane.

Lamination artifact 840 is illustratively on or in layer 812, while lamination artifact 842 is in layer 812 but also extends into layer 804. As in FIG. 20, these artifacts could, for example, be artifacts of contact pressure or of heat, as described above, or other changes in structure of layer 812 indicating that it was laminated rather than being deposited on or attached to backplane fragment 822 in some other way. In the particular example illustrated, layer 812 has relatively flat surface 814 while backplane fragment 822 differs laterally in thickness and has a protrusion in its surface 824, so that one or both of artifacts 840 and 842 could be artifacts of surface shape. As above, a given artifact could be an artifact of surface shape and also one or both of an artifact of contact pressure and an artifact of heat.

In the lamination technique of FIG. 22, a surface of a polymer-containing layer meets a surface of a top electrode at an interface surface. Polymer-containing layers are produced on a backplane before lamination, such as by solution processing, and lamination artifacts of various kinds could occur at the interface surface or in the polymer-containing layer whose surface meets the top electrode surface.

As shown in cross section 850, backplane fragment 852 has polymer-containing layer 854. Layer 854 could be produced on backplane fragment 852, such as by spin-coating, dip-coating, or laminating a CTL or a CGL. As shown in cross section 860, polymer-containing layer 862 has been produced on layer 854, again such as by spin-coating, dip-coating, or laminating a CGL or a CTL. As an alternative, layers 854 and 862 could be concurrently laminated to fragment 852 in sheet form. In any case, layer 862 has surface 864 suitable for lamination.

As shown in cross section 870, top electrode fragment 872 does not have a polymer-containing layer over its surface 874 prior to lamination. But surface 874 must be suitable for lamination with surface 864.

Cross section 880 shows the result of lamination, in which IC fragment 882 includes backplane fragment 852, top electrode fragment 872, and both of polymer-containing layers 854 and 862. In this implementation, interface surface 884 occurs where surfaces 864 and 874 meet, between layer 862 and the top electrode. Lamination artifact 890 is illustratively on or in layer 862, and could be one or more of an artifact of contact pressure, an artifact of heat, and an artifact of surface shape.

In addition to lamination artifacts as described above, a device, array, or other product manufactured by lamination as described above is likely to include other features resulting from the specific techniques used above, providing evidence that the above techniques have been used. For example, the techniques described in relation to FIGS. 20-22 can be used to produce layered structures in which no vias cross the interface surface between the two laminated substructures; as used herein, a via "crosses" an interface surface if the via is one of a combination of parts that provide an electrical connection between components on opposite sides of the interface surface. Also, the above-described techniques are believed to reduce or prevent occurrence of pin-hole defects, as suggested by experimental results described below. Further, techniques as in FIG. 20 may result in layers of polymer-containing material that meet at an interface surface that could not have been produced by coating; for example, some pairs of polymer-containing materials that can be laminated to each other cannot be coated onto each other.

Figure 23:
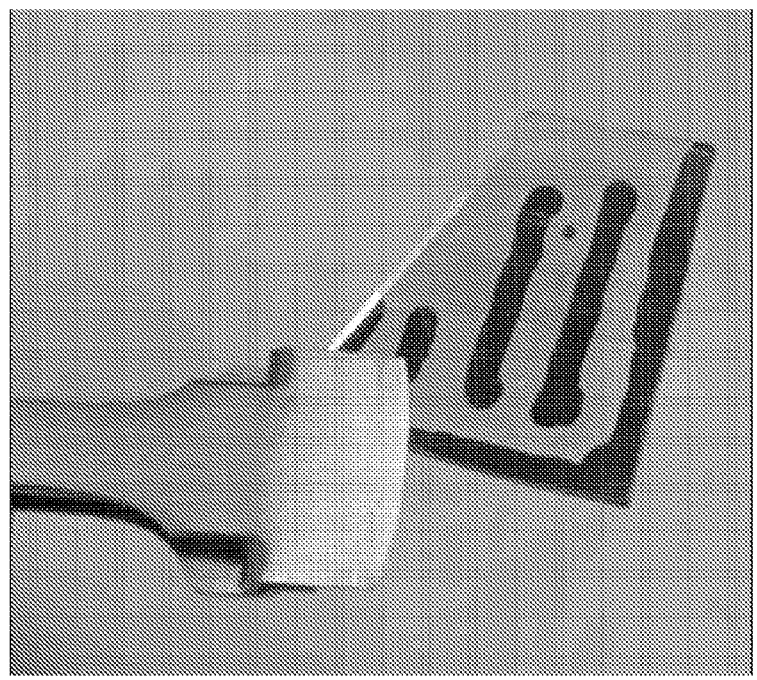
FIG. 23 is a photograph showing a sample test device produced using lamination as in FIG. 22.

FIG. 23 is a photograph of a test sample produced with a technique similar to that of FIG. 22. To simulate a backplane with two polymer-containing layers as in cross section 860, a layer of chromium was deposited on a rigid glass substrate, a layer of F8BT was spin-coated onto the chromium, and a layer of TPD/PC was spin-coated onto the F8BT. Then, to simulate lamination of a top electrode as in cross section 870, a sheet of flexible plastic substrate with a layer of ITO on it, was laminated onto the simulated backplane with polymer-containing layers. Satisfactory attachment was obtained by applying both mechanical pressure and also heat to a temperature of 70 degrees C.

Figure 24:
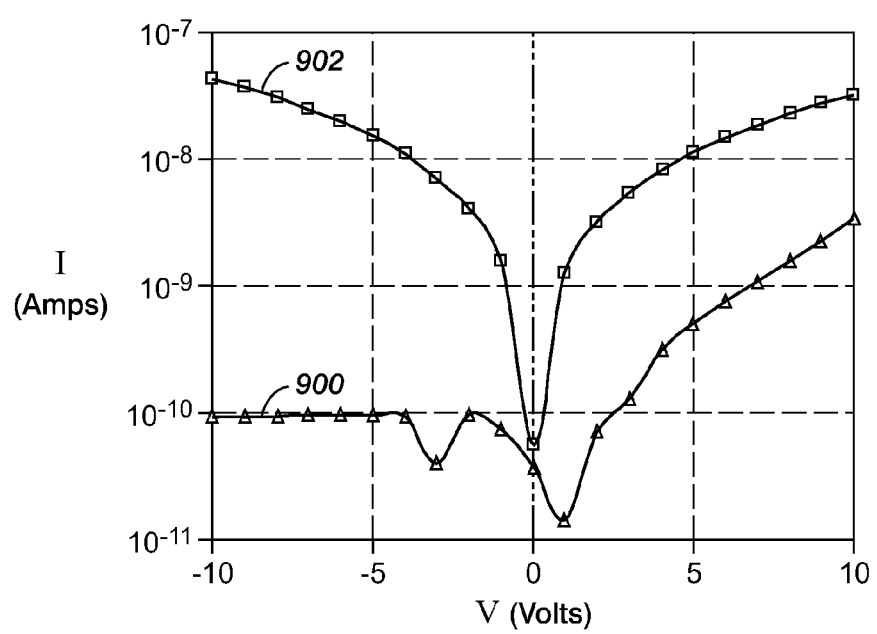
FIG. 24 is a graph showing photocurrent and dark current as a function of voltage across a sample test device as in FIG. 22.

The graph in FIG. 24 shows photocurrent I as a function of voltage difference V, measured for a test sample device as in FIG. 23. Plotted line 900 shows current in darkness, while plotted line 902 shows photocurrent when illuminated through the simulated top electrode with 0.46 mW of broadband light. Measured responsivity was approximately equal to $9^{-5}$ Amps/Watt at $-10$ Volts. The photoresponse illustrated by line 902 is similar to that for similar devices with top metal evaporated directly onto a CTL/CGL stack.

Figure 25:
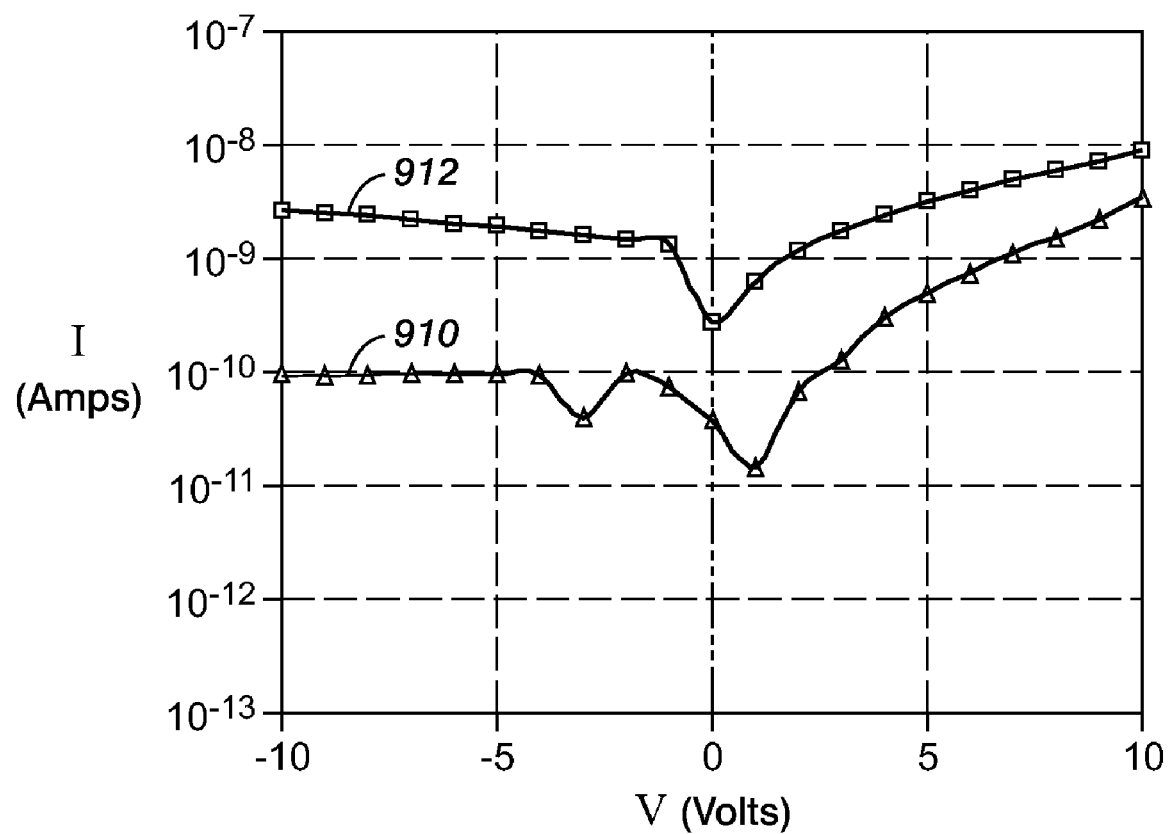
FIG. 25 is a graph comparing dark current as a function of voltage of a sample test device as in FIGS. 23 and 24 with dark current of a similar device with an evaporated metal top electrode.

The graph in FIG. 25 compares dark current for the test sample device, i.e. plotted line 910 which is the same as line 900 in FIG. 24, with dark current for a similar device with evaporated top metal, shown by plotted line 912. As can be seen, the dark current is lower for the laminated device, and this is believed to occur because the lamination technique avoids pin-hole shorting that occurs when metal is directly evaporated onto polymer to form top contacts.

As illustrated by FIGS. 23-25, lamination techniques similar to those described herein have been successfully tested, and the result included satisfactory photoresponse and reduced dark current. The lamination techniques described above are therefore expected to provide a robust way to make devices, arrays, and other products, including various additional products besides the specific types mentioned herein.

Some of the implementations described above in relation to FIGS. 1-25 are examples of a method that produces a layered structure with laminated first and second substructures; the layered structure includes an array with cell regions. The first substructure includes layered active circuitry and has a first surface, while the second includes a top electrode layer and has a second surface. The method moves the first and second substructure so that the first and second surfaces move toward each other until they meet, and attaches the first and second substructures to each other so that each of a set of the cell regions includes portions of the first and second substructures between which the first and second surfaces meet. One of the first and second surfaces is on a polymer-containing layer that contacts the other when they meet, and the polymer-containing layer is structured so that free charge carriers can be generated in it or charge carriers can be transported through it. A cell region's portion of a first subregion that includes electrically conductive material and a second that includes semiconductive material, while its portion of the second substructure includes part of the top electrode layer.

In specific implementations, the first and second surfaces meet at an interface surface, and the method, prior to moving the first and second substructures, produces the polymer-containing layer such that, during operation, at least one of the following: in response to light, free charge carriers are generated in the polymer-containing layer; and/or in response to electric field, charge carriers are transported to or from the interface surface through the polymer-containing layer. The method can produce the polymer-containing layer by depositing polymer material or one or more blends of polymers, such as polymerized organic compounds, several of which are listed above. The method could, for example, produce a dispersion of organic polymer photoconductor material in a binding matrix; produce a single organic photoconductor material in a binding matrix; and/or produce a dispersion of conductive organic polymer material in a binding matrix.

In further specific implementations, the first and second surfaces are on first and second polymer-containing layers, and the method can, prior to moving and attaching the first and second substructures, produce the first polymer-containing layer on the first substructure and the second on the second substructure. In another example, the first surface can be on the layered active circuitry, and the second substructure can include the polymer-containing layer, which has the second surface; the method can, prior to moving and attaching the first and second substructures, produce the polymer-containing layer on the second substructure. Or, the first substructure can include the polymer-containing layer with the first surface, and the second surface can be on the top electrode layer; the method can, prior to moving and attaching the substructures, produce the polymer-containing layer on the first substructure.

In moving the substructure, the method can move them toward each other, for example. The first substructure can include a conductive line that extends across the array along cell regions, and the second substructure can include a top electrode strip; the method can align the substructure so that the top electrode strip is not over the conductive line but is over at least part of each of the cell regions along which it extends. In attaching the substructures, the method can press the first and second surfaces against each other and/or apply heat while they are against each other.

Some of the implementations described above in relation to FIGS. 1-25 are examples of devices that include a layered structure within which are one or more lamination artifacts. The layered structure can include first and second substructures that meet at an interface surface, with the first substructure including active layers and a first surface and the second structure including top electrode layers and a second surface, the first and second surfaces meeting at the interface surface. The structure can also include polymer-containing layers, each in one of the substructures, and one or both of the first and second surfaces can be a surface of a polymer-containing layer structured so that free charge carriers can be generated in it or charge carriers can be transported through it. The structure can also include two or more cell regions, each including portions of the first and second substructures between which the first and second surfaces meet at the interface surface; the cell region's first substructure portion includes an active layer portion with a first subregion of electrically conductive material and a second subregion of semiconductive material, while the cell region's portion of the second substructure includes part of the top electrode layer. At least one of the lamination artifacts is on or in the polymer-containing layer of one of the first and second surfaces.

In specific implementations, the polymer-containing layers can include materials as described above. The polymer-containing layers can include a first layer in which free charge carriers are generated in response to light and a second layer in which charge carriers are transported to or from the interface surface in response to electric field, with each cell region including parts of both layers. The first layer can, for example, include one or both of a dispersion of organic polymer photoconductor material in a binding matrix and a single organic photoconductor material in a binding matrix. The second layer can include a dispersion of conductive organic polymer material in a binding matrix. Both layers can be in one of the substructures.

In further specific implementations, a pattern of light can be provided to the first layer causing generation of free charge carriers, and the device can also include circuitry connected to a cell region's active layer portions and to at least one of the cell region's top electrodes; the circuitry can provide signals that produce an electric field in the cell region's part of the second layer causing free charge carriers to be transported to or from the interface surface.

In further specific implementations, each of the substructures can include one of the polymer-containing layers, and the first and second surfaces can each be on a respective polymer-containing layer. Or the first surface can be on the layered active circuitry and the second substructure can include one of the polymer-containing layers that has the second surface. Or the first substructure can include one of the polymer-containing layers that has the first surface and the second surface can be on at least one of the top electrode layers.

In further specific implementations, the array can be a photosensing array. The lamination artifacts can include an artifact of contact pressure, an artifact of heat, and/or an artifact of surface shape. The layered array structure can include no vias crossing the interface surface.

Some of the implementations described above in relation to FIGS. 1-25 are examples of a light-interactive array that includes first and second substructures that meet at an interface surface. The first substructure can include active layers and can have a first surface, while the second substructure can include top electrode layers and can have a second surface. The first and second surfaces can meet at the interface surface. The array can also include first and second polymer-containing layers, with free charge carriers being generated in the first polymer-containing layer in response to light and with at least one of the first and second surfaces being a surface of one of the polymer-containing layers, each of which is in one of the substructures. The array can also include cell regions, each of a set of which include portions of the first and second substructures; the portion of the first substructure can include portions of active layers with first and second types of subregions, and the portion of the second substructure can include portions of top electrode layers with one or more top electrodes for the cell region. The cell region can also include parts of the polymer-containing layers between its active layer portions and its top electrodes. Each type of subregion in the cell region can include either electrically conductive material or semiconductive material. The array can also include lamination artifacts, at least one of which is in or on the polymer-containing layer of one of the first and second surfaces. The cell region also has circuitry connected to its active layer portions and to at least one of its top electrodes; in operation, the circuitry provides signals producing an electric field in the cell region's part of the second layer causing free charge carriers generated in the part of the first layer to be transported to or from the interface surface.

In specific implementations, the array can include features as described above in relation to devices.

The lamination techniques described above are advantageous because they make it possible to produce a layered structure that includes an active circuitry layer and a top electrode layer, with one or more polymer-containing layer between them but with reduction in problems like those resulting from pin-hole defects. These techniques are particularly applicable to light-interactive applications such as photosensing arrays, but could be applied in various other contexts.

The exemplary implementations described above are illustrated with specific shapes, dimensions, and other characteristics, but the scope of the invention includes various other shapes, dimensions, and characteristics. For example, the particular shapes of layer parts in a layered structure could be different, and could be of appropriate sizes for any particular array or other device. Furthermore, rather than being produced with the particular lamination operations involving polymer-containing layers and other layers as described above, arrays and other devices as described above could be produced with various other lamination operations and could include layered structures with various other materials and characteristics.

Similarly, the exemplary implementations described above include specific examples of polymer materials, but any appropriate polymer materials could be employed. Further, the above exemplary array implementations employ specific cell geometries, but a wide variety of other such geometries could be used within the scope of the invention. The invention is not limited to the specific examples of cell circuitry described above, but could be used with other cell circuitry that performs photosensing, other light interactions, or other operations. Furthermore, the lamination techniques described above could be used to produce an incomplete structure, which could then be marketed for completion and inclusion in a finished product.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A device comprising:

a layered array structure including:

first and second substructures that meet and are attached at an interface surface, the first substructure including one or more active layers and having a first surface and the second substructure including one or more top electrode layers and having a second surface; the first and second surfaces meeting at the interface surface;

one or more polymer-containing layers, each in a respective one of the first and second substructures; and two or more cell regions; each of a set of the cell regions including respective portions of the first and second substructures between which the first and second surfaces meet at the interface surface, with the cell region's first substructure portion including respective active layer portions that include at least a first subregion that includes electrically conductive material and at least a second subregion that includes semiconductive material and with the cell region's second substructure portion including a respective part of at least one of the top electrode layers;

the layered array structure further including at least one of:

(1) a first polymer-containing layer in the first substructure, the first surface being a surface of the first polymer-containing layer, the first polymer-containing layer being structured so that free charge carriers can be generated in it or charge carriers can be transported through it; the layered array structure including, on or in the first polymer-containing layer, a change in one or more of shape, texture, and composition, the change resulting from one or more of:

(1a) increased pressure in an operation that attached the first and second substructures at the interface surface;

(1b) increased temperature in an operation that attached the first and second substructures at the interface surface; and (1c) difference in shape of the first and second surfaces during an operation that attached the first and second substructures at the interface surface;

(2) a second polymer-containing layer in the second substructure, the second surface being a surface of the second polymer-containing layer, the second polymer-containing layer being structured so that free charge carriers can be generated in it or charge carriers can be transported through it; the layered array structure including, on or in the second polymer-containing layer, a change in one or more of shape, texture, and composition, the change resulting from one or more of:

(2a) increased pressure in an operation that attached the first and second substructures at the interface surface;

(2b) increased temperature in an operation that attached the first and second substructures at the interface surface; and (2c) difference in shape of the first and second surfaces during an operation that attached the first and second substructures at the interface surface; and (3) a first polymer-containing layer in the first substructure and a second polymer-containing layer in the second substructure, the first and second surfaces being surfaces respectively of the first and second polymer-containing layer; the first and second polymer-containing layers including first and second polymer-containing materials, respectively; the first and second polymer-containing materials being materials that can be laminated to each other.

2. The method of claim 1 in which, after the act of moving the first and second substructures, the first and second surfaces meet at an interface surface, the method further comprising:

prior to the act of moving the first and second substructures, producing the polymer-containing layer such that, during operation, at least one of:

in response to light, free charge carriers are generated in the polymer-containing layer; and in response to electric field, charge carriers are transported to or from the interface surface through the polymer-containing layer.

3. The method of claim 2 in which the act of producing the polymer-containing layer comprises:

depositing polymer material or one or more blends of polymers.

4. The method of claim 2 in which the polymer-containing layer includes one or more of tetraphenylenediamine; poly(3-hexylthiophene); poly[(2-alkoxy,5-alkoxy)-1,4-phenylene vinylene]; titanyl phthalocyanine; poly(vinylbutyral); poly(9,9-dioctylfluorene-alt-benzothiadiazole) (F8BT); N,N'-diphenyl-N,N'bis(3-methylphenyl)-(1-1'-biphenyl)-4,4'-diamine (TPD); and alkylated-4,-4'diphenoquinones (DPQ).

5. The method of claim 1 in which the first and second substructures include first and second polymer-containing layers, respectively, and the first and second surfaces are on the first and second polymer-containing layers, respectively; the method further comprising:

prior to the acts of moving and attaching the first and second substructures, producing the first polymer-containing layer on the first substructure and producing the second polymer-containing layer on the second substructure.

6. The method of claim 1 in which the first surface is on the layered active circuitry and the second substructure includes the polymer-containing layer, the second surface being on the polymer-containing layer; the method further comprising:

prior to the acts of moving and attaching the first and second substructures, producing the polymer-containing layer on the second substructure.

7. The method of claim 1 in which the first substructure includes the polymer-containing layer, the first surface being on the polymer-containing layer; the second surface being on the top electrode layer; the method further comprising:

prior to the acts of moving and attaching the first and second substructures, producing the polymer-containing layer on the first substructure.

8. The method of claim 1 in which the act of moving the first and second substructures comprises:

moving the first and second substructures toward each other.

9. The method of claim 1 in which the first substructure includes a conductive line that extends across the array along two or more of the cell regions and the second substructure includes a top electrode strip; the method further comprising:

aligning the first and second substructures so that the top electrode strip is not over the conductive line but is over at least part of each of the cell regions along which the conductive line extends.

10. The method of claim 1 in which the act of attaching the first and second substructures comprises at least one of:

pressing the first and second surfaces against each other; and applying heat while the first and second surfaces are against each other.

11. A device comprising:

a layered array structure including:

first and second substructures that meet at an interface surface, the first substructure including one or more active layers and having a first surface and the second substructure including one or more top electrode layers and having a second surface; the first and second surfaces meeting at the interface surface;

one or more polymer-containing layers, each in a respective one of the first and second substructures; at least one of the first and second surfaces being a surface of a respective one of the polymer-containing layers that is structured so that free charge carriers can be generated in it or charge carriers can be transported through it;

two or more cell regions; each of a set of the cell regions including respective portions of the first and second substructures between which the first and second surfaces meet at the interface surface, with the cell region's first substructure portion including respective active layer portions that include at least a first subregion that includes electrically conductive material and at least a second subregion that includes semiconductive material and with the cell region's second substructure portion including a respective part of at least one of the top electrode layers; and within the layered array structure, one or more lamination artifacts; at least one of the lamination artifacts being on or in the respective polymer-containing layer of at least one of the first and second surfaces.

12. The device of claim 11 in which each of the polymer-containing layers includes at least one of polymer material and blends of polymers.

13. The device of claim 11 in which each of the polymer-containing layers includes one or more of tetraphenylenediamine; poly(3-hexylthiophene); poly[(2-alkoxy,5-alkoxy)-1,4-phenylene vinylene]; titanyl phthalocyanine; poly(vinylbutyral); poly(9,9-dioctylfluorene-alt-benzothiadiazole) (F8BT); N,N'-diphenyl-N,N'bis(3-methylphenyl)-(1-1'-biphenyl)-4,4'-diamine (TPD); and alkylated-4,-4'diphenoquinones (DPQ).

14. The device of claim 11 in which the polymer-containing layers include:

a first layer in which free charge carriers are generated in response to light; and a second layer in which charge carriers are transported to or from the interface surface in response to electric field;

each cell region further including respective parts of the first and second layers.

15. The device of claim 14 in which the first layer includes at least one of:

a dispersion of organic polymer photoconductor material in a binding matrix; and a single organic photoconductor material in a binding matrix.

16. The device of claim 14 in which the second layer includes a dispersion of conductive organic polymer material in a binding matrix.

17. The device of claim 14 in which the first and second layers are both in one of the first and second substructures.

18. The device of claim 14 in which, in operation, a pattern of light is provided to the first layer causing generation of free charge carriers; the device further comprising:

for each of a set of the cell regions, circuitry connected to the cell region's active layer portions and to at least one of the cell region's top electrodes; in operation, the circuitry providing signals that produce an electric field in the cell region's part of the second layer causing free charge carriers generated by the cell region's part of the first layer in response to the pattern of light to be transported to or from the interface surface.

19. The device of claim 11 in which the first and second substructures include first and second ones of the polymer-containing layers, respectively, and the first and second surfaces are on the first and second polymer-containing layers, respectively.

20. The device of claim 11 in which the first surface is on at least one of the active layers and the second substructure includes a first one of the polymer-containing layers, the second surface being on the first polymer-containing layer.

21. The device of claim 11 in which the first substructure includes a first one of the polymer-containing layers, the first surface being on the first polymer-containing layer; the second surface being on at least one of the top electrode layers.

22. The device of claim 11 in which the lamination artifacts include at least one of:

an artifact of contact pressure;
an artifact of heat; and
an artifact of surface shape.

23. The device of claim 22 in which no vias cross the interface surface.

24. A light-interactive array comprising:

first and second substructures that meet at an interface surface, the first substructure including one or more active layers and having a first surface and the second substructure including one or more top electrode layers and having a second surface; the first and second surfaces meeting at the interface surface;

first and second polymer-containing layers; in response to light, free charge carriers being generated in the first polymer-containing layer; each of the first and second polymer-containing layers being in a respective one of the first and second substructures; at least one of the first and second surfaces being a surface of a respective one of the first and second polymer-containing layers;

two or more cell regions; each of a set of the cell regions including a respective portion of each of the first and second substructures, with the cell region's first substructure portion including respective active layer portions that include subregions of first and second types, with the cell region's second substructure portion including respective top electrode layer portions that include one or more respective top electrodes for the cell region, and with the cell region also including respective parts of the first and second polymer-containing layers between the respective active layer portions and top electrodes; each type of subregions including only one of electrically conductive material and semiconductive material;

one or more lamination artifacts; at least one of the lamination artifacts being in or on the respective polymer-containing layer of at least one of the first and second surfaces; and for each of the set of the cell regions, circuitry connected to the cell region's active layer portions and to at least one of the cell region's top electrodes; in operation, the circuitry providing signals that produce an electric field in the cell region's part of the second polymer-containinq layer causing free charge carriers generated by the cell region's part of the first layer in response to light to be transported to or from the interface surface.

25. The array of claim 24 in which the first and second polymer-containing layers are both in one of the first and second substructures.

26. The array of claim 24 in which each of the first and second substructures includes a respective one of the first and second polymer-containing layers, and each of the first and second surfaces is on the respective one of the first and second polymer-containing layers.

27. The array of claim 24 in which the first surface is on one of the active layers and the second substructure includes both of the first and second polymer-containing layers, the second surface being on one of the first and second polymer-containing layers.

28. The array of claim 24 in which the first substructure includes both of the first and second polymer-containing layers, the first surface being on one of the first and second polymer-containing layers, the second surface being on at least one of the top electrode layers.

29. The array of claim 24 in which the array is a photosensing array.

30. A method of producing a device as in claim 1, the method comprising:

producing the layered structure; the act of producing the layered structure comprising:

moving the first and second substructures so that the first and second surfaces move toward each other until they meet; at least one of the first and second surfaces being on a polymer-containing layer that contacts the other of the first and second surfaces when they meet; the polymer-containing layer being structured so that free charge carriers can be generated in it or charge carriers can be transported through it; and attaching the first and second substructures to each other so that each of a set of the cell regions in the array includes respective portions of the first and second substructures between which the first and second surfaces meet, with the cell region's respective first substructure portion including at least a first subregion that includes electrically conductive material and a second subregion that includes semiconductive material and with the cell region's respective second substructure portion including a respective part of the top electrode layer.

31. The device of claim 1 in which the layered array structure includes both the first polymer-containing layer in the first substructure and the second polymer-containing layer in the second substructure and the first and second surfaces are surfaces respectively of the first and second polymer-containing layer; the layered array structure including, spatially isolated at the interface surface, a change in one or more of shape, texture, and composition, the change resulting from one or more of:

(a) increased pressure in an operation that attached the first and second substructures at the interface surface;

(b) increased temperature in an operation that attached the first and second substructures at the interface surface; and (c) difference in shape of the first and second surfaces during an operation that attached the first and second substructures at the interface surface.

32. The device of claim 1 in which the layered array structure includes both the first polymer-containing layer in the first substructure and the second polymer-containing layer in the second substructure and the first and second surfaces are surfaces respectively of the first and second polymer-containing layer; the layered array structure further including a charge generation layer in which free charge carriers can be generated and a charge transport layer through which charge carriers can be transported; one of the first and second polymer-containing layers including the charge generation layer and the other of the first and second polymer-containing layers including the charge transport layer.

33. The device of claim 1 in which the second substructure includes a charge generation layer in which free charge carriers can be generated and a charge transport layer through which charge carriers can be transported; the second polymer-containing layer being one of the charge generation layer and the charge transport layer;

the second surface being on the second polymer-containing layer.

34. The device of claim 1 in which the first substructure includes a charge generation layer in which free charge carriers can be generated and a charge transport layer through which charge carriers can be transported; the first polymer-containing layer being one of the charge generation layer and the charge transport layer; the first surface being on the first polymer-containing layer.

* * * * *